United States Patent
Okano

(10) Patent No.: US 9,634,008 B2
(45) Date of Patent: Apr. 25, 2017

(54) SEMICONDUCTOR DEVICE AND MANUFACTURING METHOD OF SEMICONDUCTOR DEVICE

(71) Applicant: Kabushiki Kaisha Toshiba, Minato-ku (JP)

(72) Inventor: Kimitoshi Okano, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/986,952

(22) Filed: Jan. 4, 2016

(65) Prior Publication Data

US 2017/0062423 A1    Mar. 2, 2017

Related U.S. Application Data

(60) Provisional application No. 62/213,474, filed on Sep. 2, 2015.

(51) Int. Cl.

| | |
|---|---|
| *H01L 29/06* | (2006.01) |
| *H01L 27/092* | (2006.01) |
| *H01L 29/78* | (2006.01) |
| *H01L 21/8238* | (2006.01) |
| *H01L 21/762* | (2006.01) |
| *H01L 21/764* | (2006.01) |

(52) U.S. Cl.
CPC .......... *H01L 27/092* (2013.01); *H01L 21/764* (2013.01); *H01L 21/76224* (2013.01); *H01L 21/823807* (2013.01); *H01L 21/823857* (2013.01); *H01L 21/823878* (2013.01); *H01L 29/0649* (2013.01); *H01L 29/0653* (2013.01); *H01L 29/7843* (2013.01)

(58) Field of Classification Search
CPC  H01L 29/0649; H01L 29/0653; H01L 21/764
See application file for complete search history.

(56) References Cited

U.S. PATENT DOCUMENTS 7,705,417 B2    4/2010  Oishi

FOREIGN PATENT DOCUMENTS

| JP | 2001-15587 | 1/2001 |
|---|---|---|
| JP | 2002-270824 | 9/2002 |
| JP | 2008-41901 | 2/2008 |

*Primary Examiner* — Amar Movva
(74) *Attorney, Agent, or Firm* — Oblon, McClelland, Maier & Neustadt, L.L.P.

(57) ABSTRACT

According to one embodiment, a semiconductor device includes an element isolation insulating film, a gate electrode film, source/drain regions, a channel region, and an air gap. The element isolation insulating film partitions an element arrangement area on one main face side of a semiconductor substrate. The channel region is disposed near a surface of the semiconductor substrate below the gate electrode film. The air gap is disposed at a region of the element isolation insulating film contacting with the channel region.

13 Claims, 22 Drawing Sheets

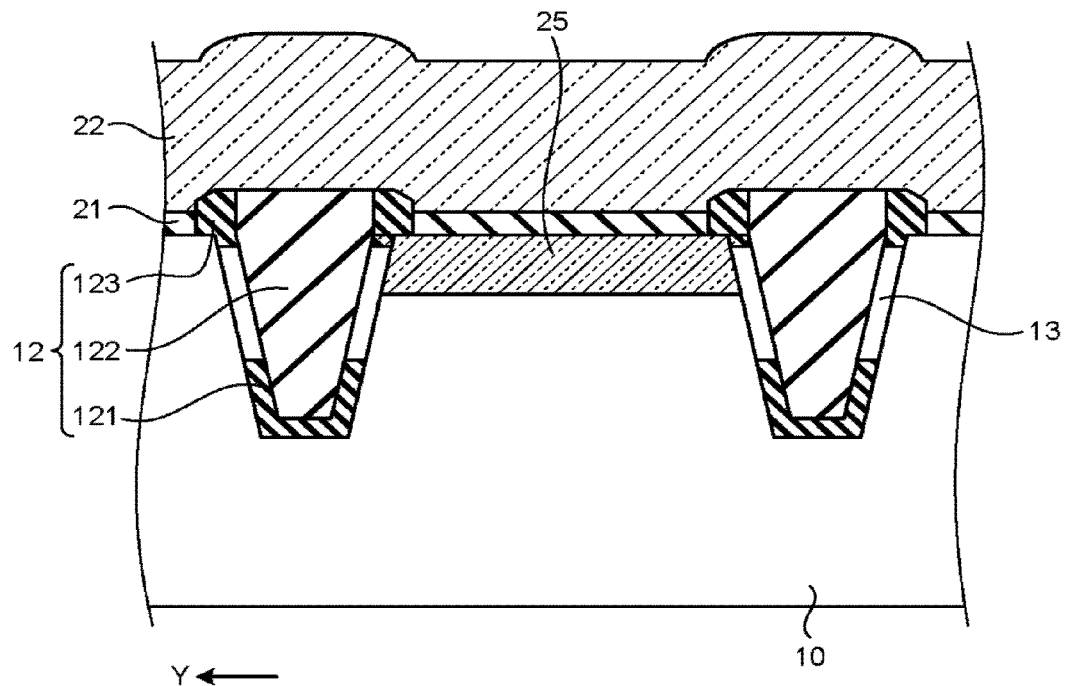
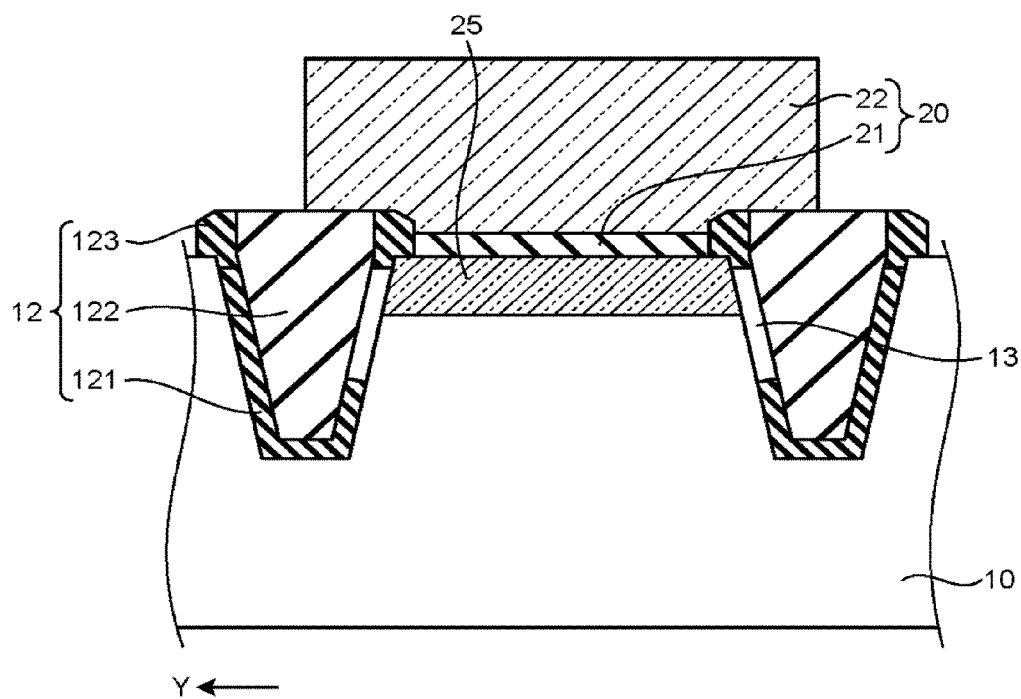

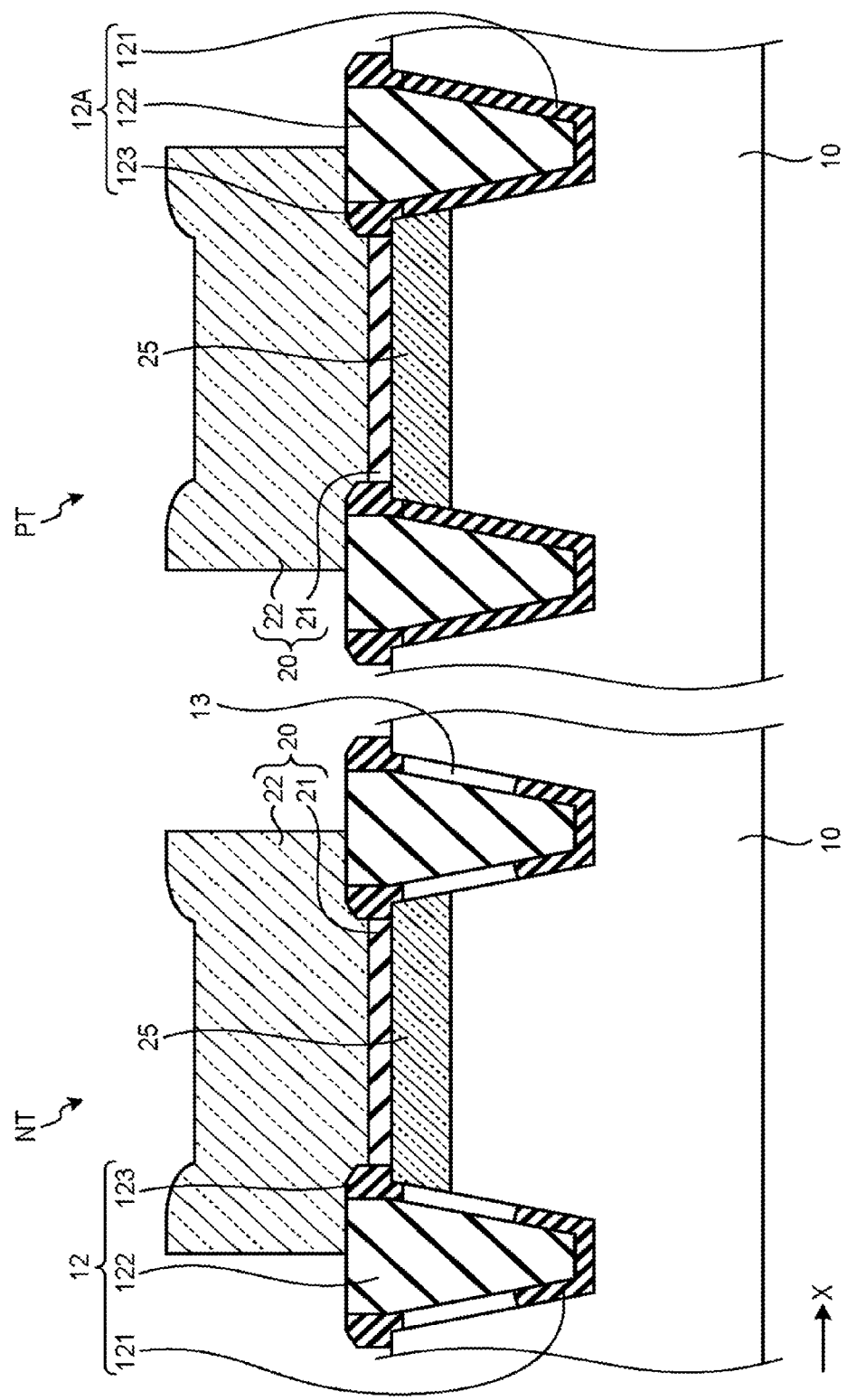

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority from U.S. Provisional Application No. 62/213,474, filed on Sep. 2, 2015; the entire contents of which are incorporated herein by reference.

FIELD

Embodiments described herein relate generally to a semiconductor device and a manufacturing method of a semiconductor device.

BACKGROUND

In general, an oxide film is used as a material buried for forming an element isolation insulating film that partitions a field effect transistor. It is known that, as the channel width of the field effect transistor becomes smaller, there is more easily caused a narrow channel effect in which the threshold voltage increases or decreases. This is thought to be caused by migration of boron (B) from the channel region of the field effect transistor into the oxide film composing the element isolation insulating film, and/or by the presence of a fixed charge contained in the oxide film. On the other hand, the oxide film composing the element isolation insulating film generates a film stress depending on the history of a heating process, and thereby brings about a change in the channel mobility of the field effect transistor. Accordingly, it is desired to reduce fluctuations in the transistor characteristics caused by the element isolation insulating film as described above.

BRIEF DESCRIPTION OF THE DRAWINGS

FIGS. 10A to 10K are sectional views showing the example of the sequence of a manufacturing method of a semiconductor device according to the first embodiment;

FIG. 11 is a sectional view schematically showing another structural example of a semiconductor device according to the first embodiment;

FIG. 15 is a sectional view schematically showing a cross section in the gate width direction of the other structural example of a semiconductor device according to the second embodiment.

DETAILED DESCRIPTION

In general, according to one embodiment, a semiconductor device includes an element isolation insulating film, a gate electrode film, source/drain regions containing a first impurity of a predetermined conductivity type diffused therein, a channel region containing a second impurity of a predetermined conductivity type diffused therein, and an air gap. The element isolation insulating film has a first depth and partitions an element arrangement area on one main face side of a semiconductor substrate. The gate electrode film is disposed above the semiconductor substrate within the element arrangement area, through a gate insulating film, and extending in a first direction. The source/drain regions are disposed near a surface of the semiconductor substrate on both sides of the gate electrode film in a second direction perpendicular to the first direction. The channel region is disposed near a surface of the semiconductor substrate below the gate electrode film. The air gap is disposed at a region of the element isolation insulating film contacting with the channel region.

Exemplary embodiments of a semiconductor device and a manufacturing method of a semiconductor device will be explained below in detail with reference to the accompanying drawings. The present invention is not limited to the following embodiments. The sectional views and top views of the semiconductor device used in the following embodiments are schematic, and so the relationship between the thickness and width of each layer and/or the thickness ratios between respective layers may be different from actual states. Further, hereinafter, an initial explanation will be given of fluctuations in the transistor characteristics of a field effect transistor caused by an element isolation insulating film, and then a subsequent explanation will be given of a semiconductor device and a manufacturing method of a semiconductor device according to an embodiment, which can suppress variations in the transistor characteristics caused by the element isolation insulating film.

Figure 1:
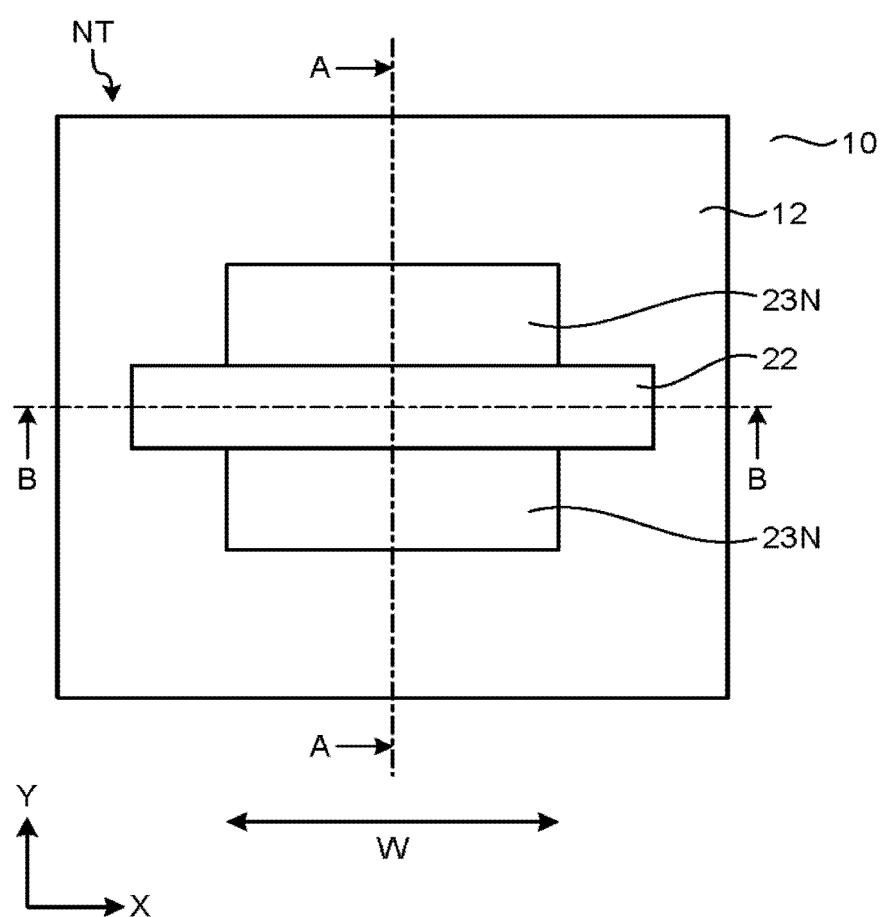
FIG. 1 is a top view schematically showing a structural example of a semiconductor device.
Figure 2:
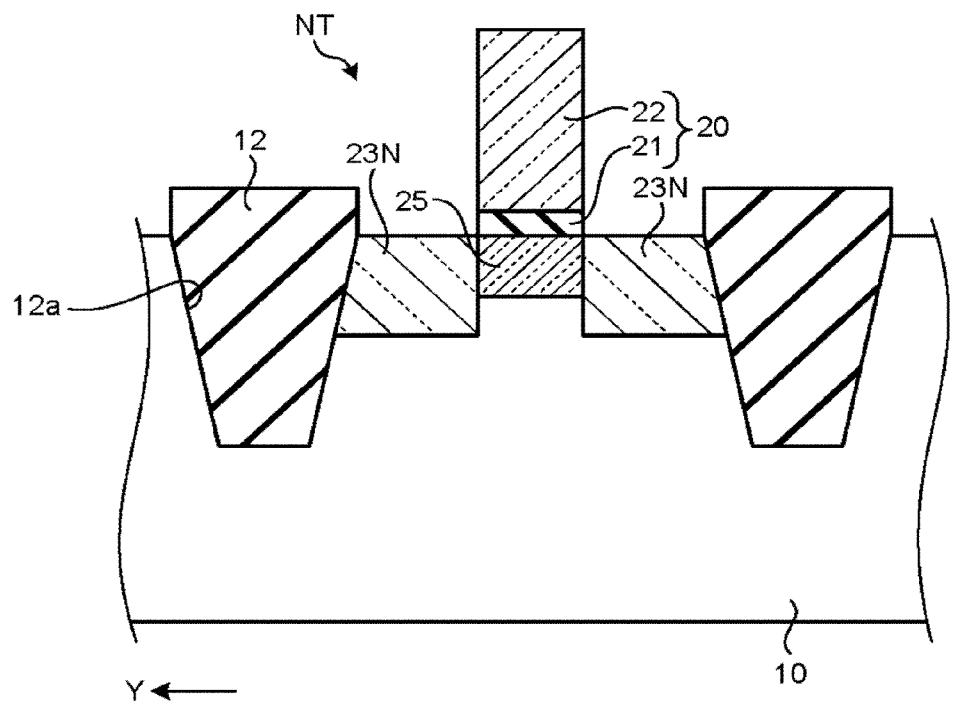
FIG. 2 is a sectional view schematically showing a cross section in the gate length direction of the structural example of a semiconductor device.
Figure 3:
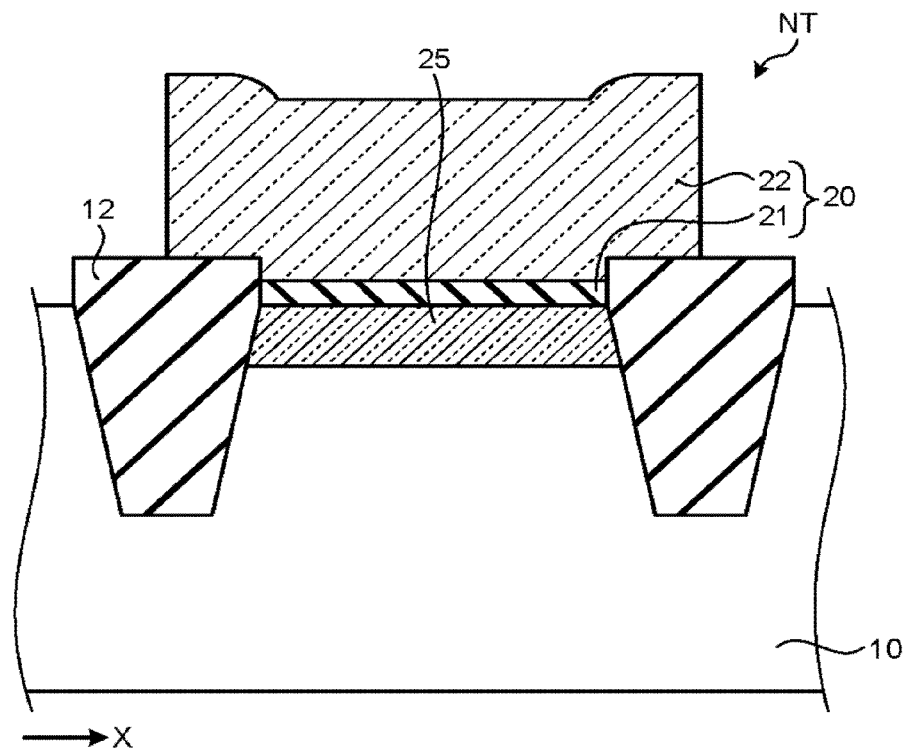
FIG. 3 is a sectional view schematically showing a cross section in the gate width direction of the structural example of a semiconductor device.

FIG. 1 is a top view schematically showing a structural example of a semiconductor device, FIG. 2 is a sectional view taken along a line A-A of FIG. 1, and FIG. 3 is a sectional view taken along a line B-B of FIG. 1. Here, in this specification, a cross section of the semiconductor device taken along the line A-A of FIG. 1 will be referred to as a cross section in the gate length direction, and a cross section of the semiconductor device taken along the line B-B of FIG. 1 will be referred to as a cross section in the gate width direction. Further, the extending direction of a gate electrode film shown in FIG. 1 will be referred to as an X-direction, and a direction perpendicular to the X-direction in FIG. 1 will be referred to as a Y-direction. Further, the following description will take as an example a case that the semiconductor device is formed of an N-type MOS (Metal-Oxide-Semiconductor) transistor (which will be referred to as an NMOS transistor, hereinafter).

An NMOS transistor NT is provided on an active area of a semiconductor substrate 10 surrounded by an element isolation insulating film 12. The NMOS transistor NT includes a gate stack 20 and source/drain regions 23N. The gate stack 20 is arranged in the active area surrounded by the element isolation insulating film 12, such that it is present near the center in the Y-direction and extends in the X-direction. The gate stack 20 has a structure in which a gate insulating film 21 and a gate electrode film 22 are stacked. The source/drain regions 23N are formed near the surface of the semiconductor substrate 10 on the opposite sides of the gate stack 20 in the Y-direction. The source/drain regions 23N are respectively formed of impurity diffusion layers containing an N-type impurity, such as phosphorus (P) or arsenic (As), diffused therein. The active area surrounded by the element isolation insulating film 12 corresponds to an element arrangement area.

The semiconductor substrate 10 may be formed of a P-type silicon substrate or the like. For example, the gate insulating film 21 is formed of a silicon oxide film, and the gate electrode film 22 is formed of an N-type poly-silicon film.

The element isolation insulating film 12 is formed of an insulating film buried in a trench 12a that is formed in the upper surface of the semiconductor substrate 10 and has a predetermined depth. For example, the element isolation insulating film 12 is made of poly-silazane, NSG (Non-doped Silicate Glass), or HDP (High Density Plasma)-SiO$_2$.

A channel region 25 doped with a P-type impurity, such as B, is formed in the semiconductor substrate 10 between the source region 23N and the drain region 23N. In this way, the NMOS transistor NT employs an N-type poly-silicon film serving as the gate electrode film 22, and the channel region 25 containing B, so that it constitutes a surface channel type transistor. In the surface channel type transistor, a channel is to be formed in the uppermost surface of the semiconductor substrate 10 near the interface with the gate insulating film 21.

For example, a non-volatile memory device, such as a NAND type flash memory, includes a memory cell part in which memory cells are arranged in an array format, and a peripheral circuit part, such as a sense amplifier, arranged around the memory cell part. The sense amplifier occupies a large ratio in the surface area of a memory chip forming the non-volatile memory device. Thus, in order to make the surface area of the memory chip smaller, each transistor used for the sense amplifier is required to reduce the gate width W. For example, an NMOS transistor NT included in the sense amplifier comes to have a gate width W of 0.3 to 0.4 µm.

Figure 4:
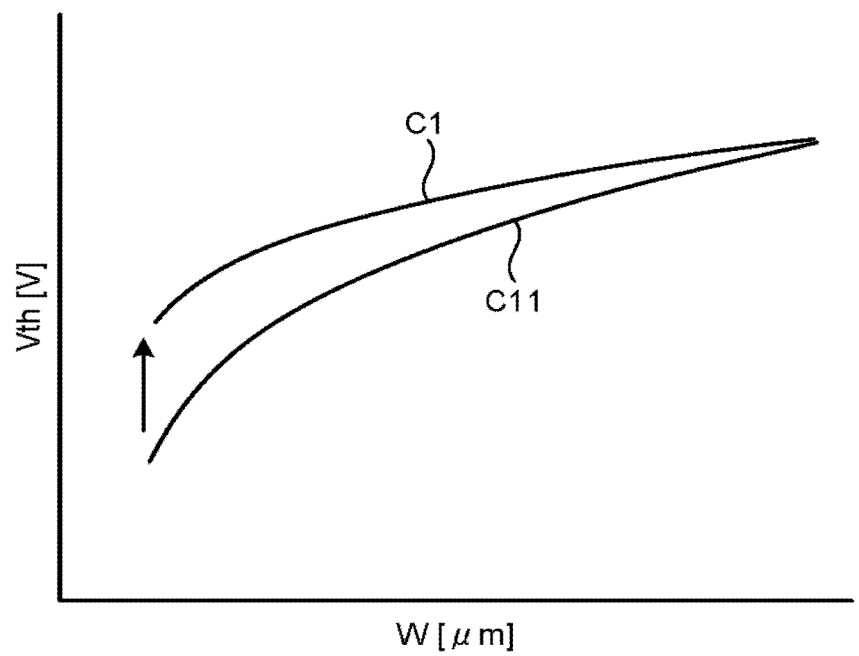
FIG. 4 is a view showing an example of a change in the threshold voltage of an NMOS transistor with respect to the channel width.

FIG. 4 is a view showing an example of a change in the threshold voltage of an NMOS transistor with respect to the channel width. In FIG. 4, the horizontal axis denotes the dimension of the channel width, and the vertical axis denotes the threshold voltage. As indicated by a curved line C11 in FIG. 4, along with a decrease in the gate width W of the NMOS transistor NT, the threshold voltage is lowered because of a narrow channel effect. As a result, the off current is increased, and the standby power consumption becomes larger. In this respect, since the number of NMOS transistors used in the sense amplifier is very large, the power consumption of the memory chip is greatly increased as a whole.

In consideration of this, it is required to suppress the narrow channel effect. The narrow channel effect is thought to occur due to diffusion of B in the channel region 25 into the element isolation insulating film 12, and/or due to the presence of a fixed charge generated in the element isolation insulating film 12. Accordingly, it is required to suppress diffusion of B in the channel region 25 into the element isolation insulating film 12, and to reduce a fixed charge generated in the element isolation insulating film 12.

It should be noted that FIGS. 1 to 3 show a structural example of the NMOS transistor NT, but, in a case that the semiconductor device is formed of a P-type MOS transistor (which will be referred to as a PMOS transistor, hereinafter), the PMOS transistor is built to have essentially the same structure as the NMOS transistor. However, the PMOS transistor differs in that it is formed on an N-type well formed in the semiconductor substrate 10, and its source/drain regions 23N are respectively formed of P-type diffusion layers containing a P-type impurity, such as B, diffused therein. The PMOS transistor employs an N-type poly-silicon film serving as the gate electrode film 22, and the channel region 25 containing B, so that it constitutes a buried channel type transistor. In the buried channel type transistor, a channel is to be formed in a portion of the semiconductor substrate 10 deeper than its uppermost surface.

Figure 5A:
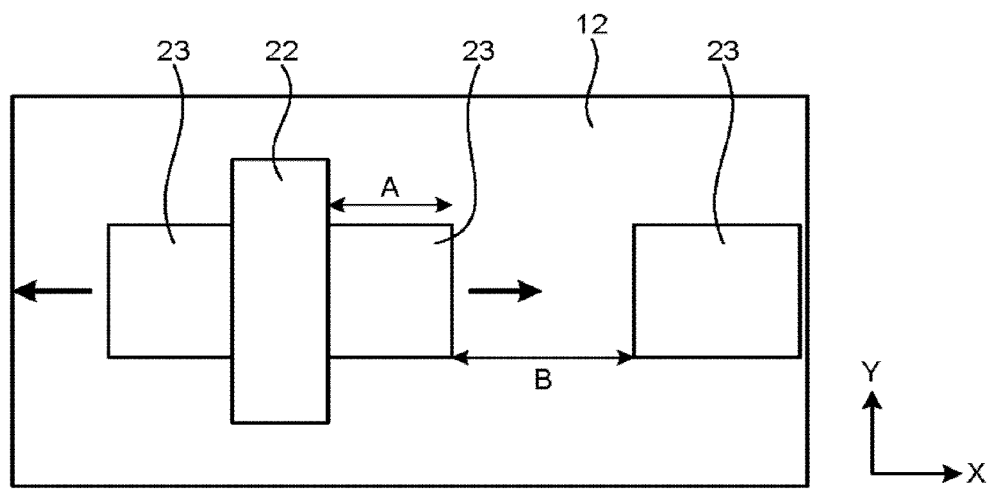
FIGS. 5A and 5B are views for explaining a change in transistor characteristics caused by a stress in an element isolation insulating film.
Figure 5B:
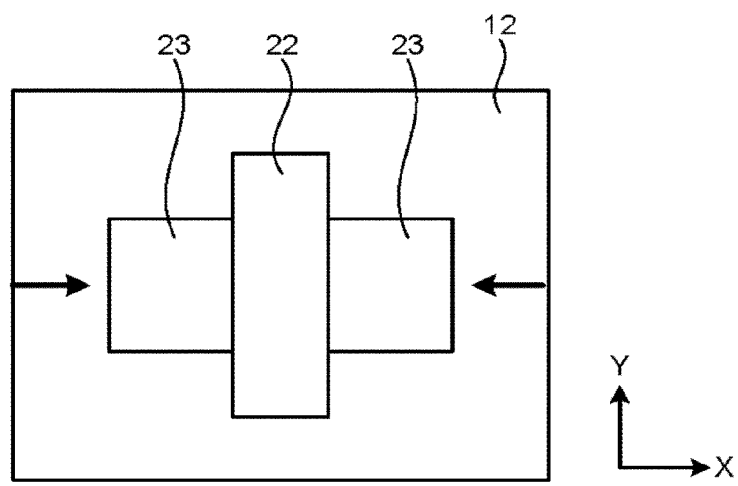

FIGS. 5A and 5B are views for explaining a change in transistor characteristics caused by a stress in an element isolation insulating film. FIG. 5A is a view showing a case that a shrinkable material is used as the element isolation insulating film, and FIG. 5B is a view showing a case that an expandable material is used as the element isolation insulating film.

As shown in FIG. 5A, where a shrinkable material, such as NSG, is used as the element isolation insulating film 12, a tensile stress is applied to the channel region 25 of a MOS transistor. Due to the tensile stress applied to the channel region 25, the carrier mobility in the channel is changed. More specifically, in the case of an NMOS transistor NT, the electron mobility in the channel is increased, and, in the case of a PMOS transistor, the hole mobility in the channel is decreased.

As shown in FIG. 5B, where an expandable material, such as an HDP-SiO$_2$ film, is used as the element isolation insulating film, a compressive stress is applied to the channel region 25 of a MOS transistor. Due to the compressive stress applied to the channel regions 25, the carrier mobility in the channel is changed. More specifically, in the case of an NMOS transistor NT, the electron mobility in the channel is decreased, and, in the case of a PMOS transistor, the hole mobility in the channel is increased.

Further, if the distance A in the X-direction from an end portion of the gate electrode film 22 on one side of the source/drain regions 23 to the element isolation insulating film 12 is altered, or if the distance B between adjacent active areas (the width of the element isolation insulating film 12) is altered, the carrier mobility in the channel of an NMOS transistor NT or PMOS transistor PT is changed. In other words, the carrier mobility in the channel has layout dependency. As a result, there is a problem such that fluctuations in the characteristics of a MOS transistor are caused by differences in layout. Accordingly, in order to reduce variations in the transistor characteristics, it is required to reduce the layout dependency of transistor characteristics.

Next, an explanation will be given of an embodiment that can suppress the narrow channel effect and reduce the layout dependency of transistor characteristics.

First Embodiment

Figure 6:
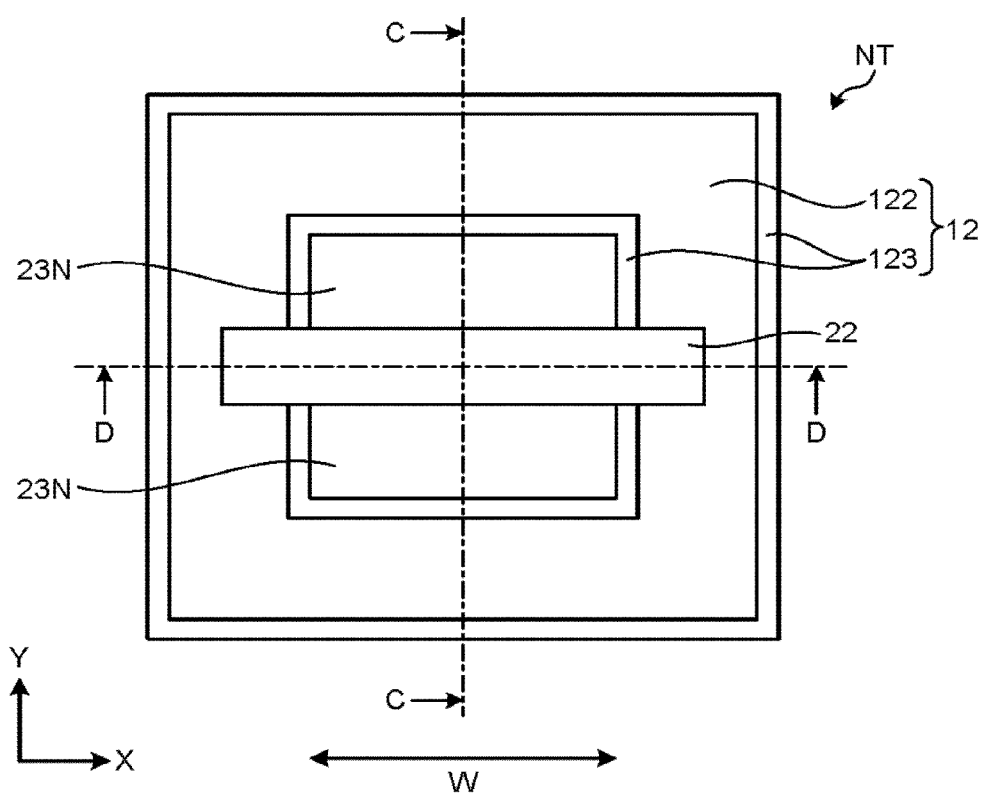
FIG. 6 is a top view showing a structural example of a semiconductor device according to a first embodiment.
Figure 7:
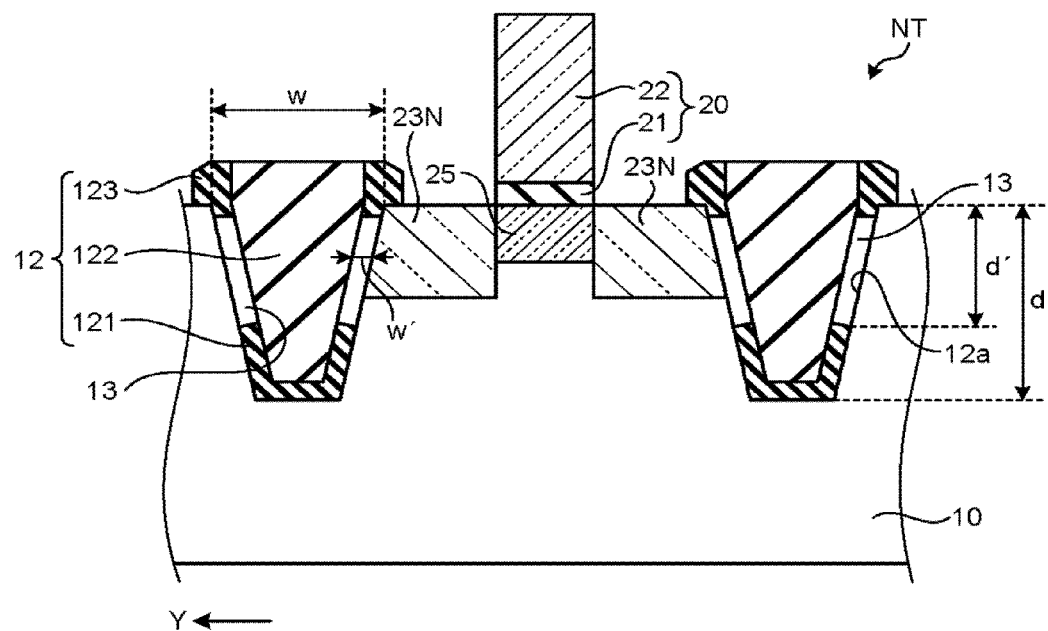
FIG. 7 is a sectional view schematically showing a cross section in the gate length direction of the structural example of a semiconductor device according to the first embodiment.
Figure 8:
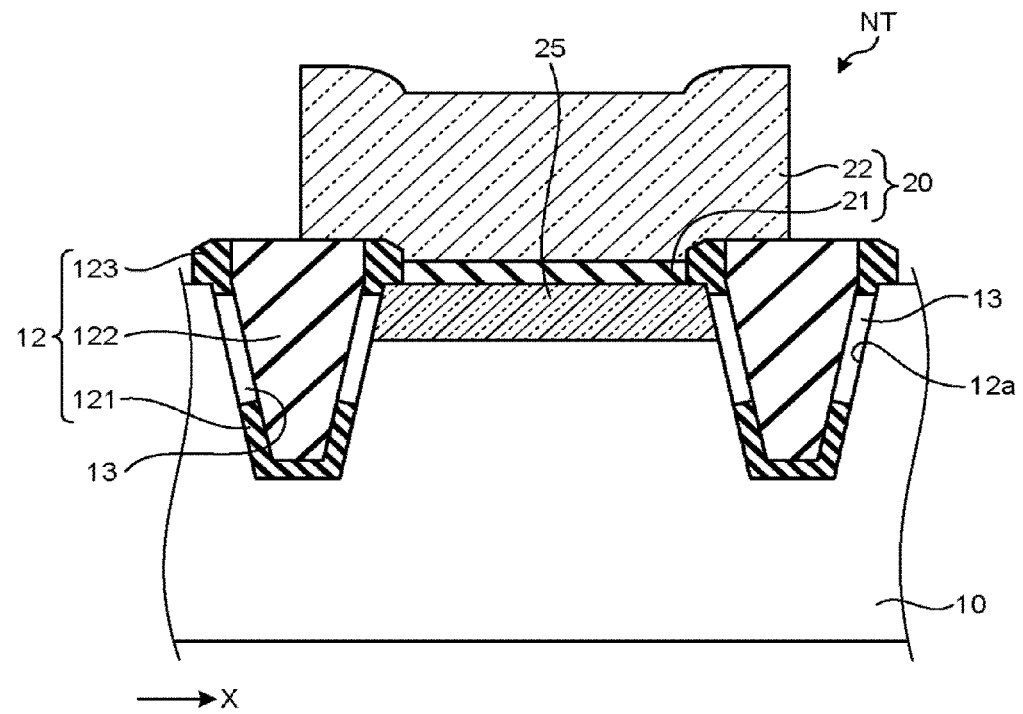
FIG. 8 is a sectional view schematically showing a cross section in the gate width direction of the structural example of a semiconductor device according to the first embodiment.

FIG. 6 is a top view showing a structural example of a semiconductor device according to a first embodiment, FIG. 7 is a sectional view taken along a line C-C of FIG. 6, and FIG. 8 is a sectional view taken along a line D-D of FIG. 6. Here again, the following description will take as an example a case that the semiconductor device is formed of an NMOS transistor.

The semiconductor device according to the first embodiment includes an element isolation insulating film 12 formed with an air gap 13 disposed at the region of the element isolation insulating film 12 contacting with a channel region 25. However, in the example shown in FIGS. 6 to 8, an air gap 13 is formed at each of the regions of the element isolation insulating film 12 contacting with the active area as well as the channel region 25.

In the example shown in FIGS. 6 to 8, the element isolation insulating film 12 includes a first insulating film 121, a second insulating film 122, and a third insulating film 123. The first insulating film 121 is formed of an insulating film having a predetermined thickness and disposed in contact with the bottom surface and bottom side lateral surface of a trench 12a. The second insulating film 122 is formed of an insulating film disposed at a predetermined distance from the lateral surface and bottom surface of the trench 12a. The second insulating film 122 is present on the first insulating film 121 near the bottom surface of the trench 12a. Further, the air gap 13 is formed between the element isolation insulating film 12 and the element arrangement area including the channel region 25. More specifically, the air gap 13 is formed between the second insulating film 122 and the lateral surface of the trench 12a, such that it is present between the first insulating film 121 near the bottom surface of the trench 12a and the third insulating film 123 near the upper surface of the semiconductor substrate 10. In other words, the air gap 13 is present at the region of the element isolation insulating film 12 contacting with the channel region 25. The third insulating film 123 is formed of an insulating film disposed on the upper side of the trench 12a and covering the air gap 13. The positions of the upper surfaces of the second insulating film 122 and the third insulating film 123 protrude upward from the position of the upper surface of the semiconductor substrate 10.

The first insulating film 121 is made of a material having an etching rate higher than that of the second insulating film 122. For example, the first insulating film 121 may be formed of a TEOS (Tetraethoxysilane) film formed by use of an LPCVD (Low Pressure Chemical Vapor Deposition) method, (which will be referred to as an LP-TEOS film, hereinafter), or an $SiO_2$ film formed by use of an ALD (Atomic Layer Deposition) method, (which will be referred to as an ALD-$SiO_2$ film, hereinafter). The second insulating film 122 may be made of HDP-$SiO_2$ or NSG. The third insulating film 123 may be formed of a silicon oxide film or plasma silane film.

It is assumed that, in a cross section of the trench 12a perpendicular to its extending direction, "w" denotes the diameter of the trench 12a at the top, "d" denotes the trench depth, "w'" denotes the width of the air gap 13 in the Y-direction (which corresponds to the thickness of the first insulating film 121), and "d'" denotes the depth of the air gap 13 from the upper surface of the semiconductor substrate 10. The width w' of the air gap 13 is preferably set to fall within a range of (1/50)×w to (1/2)×w. Alternatively, the width w' of the air gap 13 is preferably set to fall within a range of 10 to 50 nm. Further, the depth d' of the air gap is preferably set to fall within a range of (1/2)×d to (2/3)×d. Here, the other components of this configuration are the same as those explained with reference to FIGS. 1 to 3, and so their description will be omitted.

Further, in a case that the semiconductor device is formed of a PMOS transistor, the PMOS transistor is built to have essentially the same structure as the NMOS transistor, but the PMOS transistor differs in that it is formed on an N-type well formed in the semiconductor substrate 10, and its source/drain regions 23N are respectively formed of P-type diffusion layers containing a P-type impurity, such as B, diffused therein.

As described above, the air gap 13 is disposed at the region of the element isolation insulating film 12 contacting with the channel region 25, by which B in the channel region 25 (the upper surface of the semiconductor substrate 10) can be suppressed from diffusing into the element isolation insulating film 12. Further, since the element isolation insulating film 12 is partly replaced with the air gap 13, the fixed charge in the element isolation insulating film 12 can be reduced. By means of these factors, the narrow channel effect can be suppressed.

Further, near the upper side of the semiconductor substrate 10, the element isolation insulating film 12 is out of contact with semiconductor substrate 10, and so the channel region 25 do not receive any compressive stress or tensile stress from the material of the element isolation insulating film 12. As a result, it is possible to suppress fluctuations of transistor characteristics caused by a stress from the element isolation insulating film.

Next, an explanation will be given of a manufacturing method of the semiconductor device having the structure described above. FIGS. 9A to 9K are top views showing an example of the sequence of a manufacturing method of the semiconductor device according to the first embodiment. FIGS. 10A to 10K are sectional views showing the example of the sequence of a manufacturing method of the semiconductor device according to the first embodiment, and they are sectional views taken along a line E-E of FIGS. 9A to 9K.

Figure 9A:
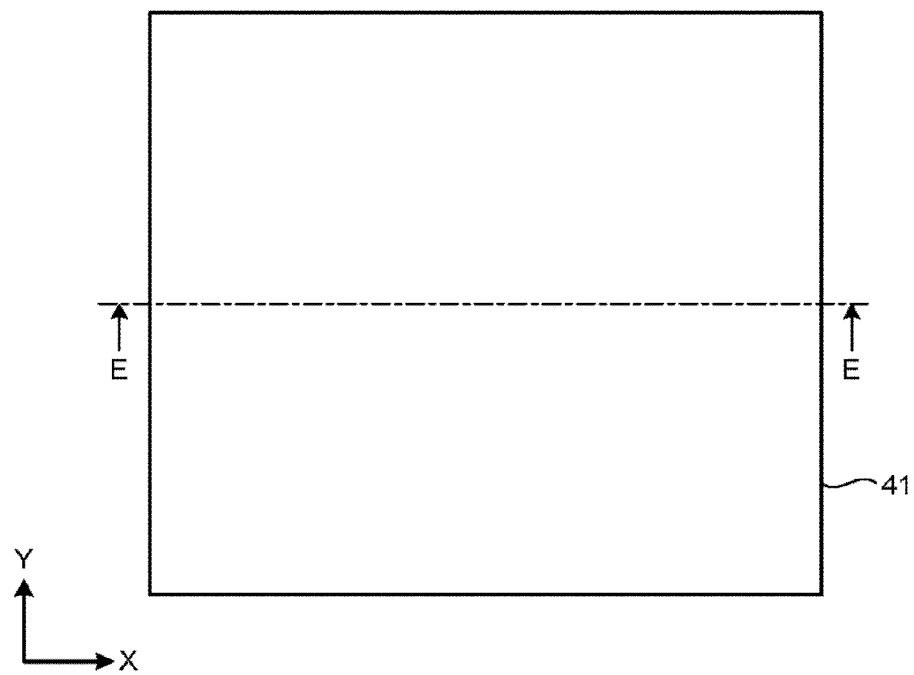
FIGS. 9A to 9K are top views showing an example of the sequence of a manufacturing method of a semiconductor device according to the first embodiment.
Figure 10A:
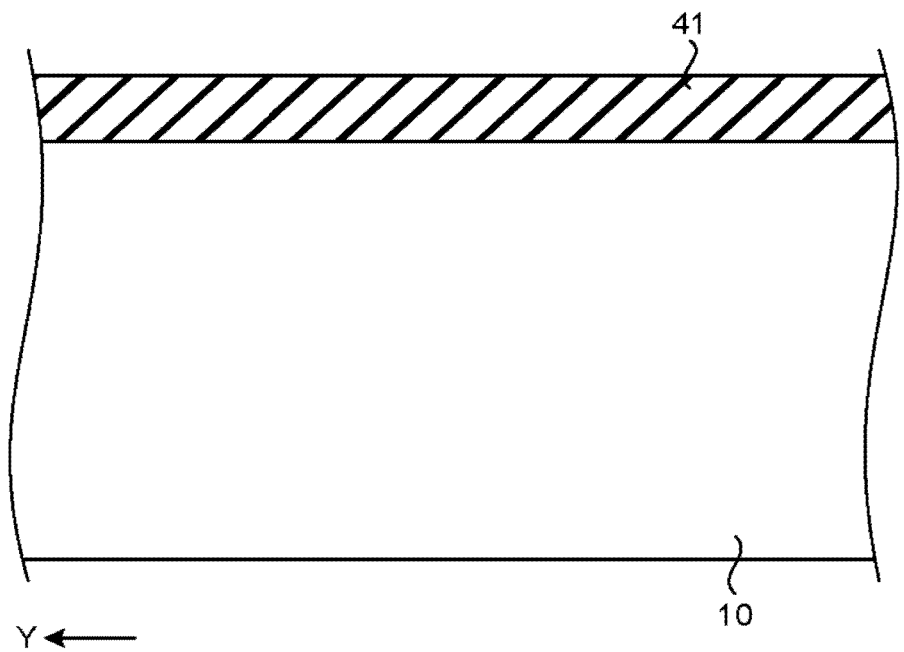

At first, as shown in FIGS. 9A and 10A, a hard mask film 41 is formed on a semiconductor substrate 10. The semiconductor substrate 10 may be formed of a P-type single-crystalline silicon substrate, for example. Further, the hard mask film 41 may be formed of a silicon nitride film, for example.

Figure 9B:
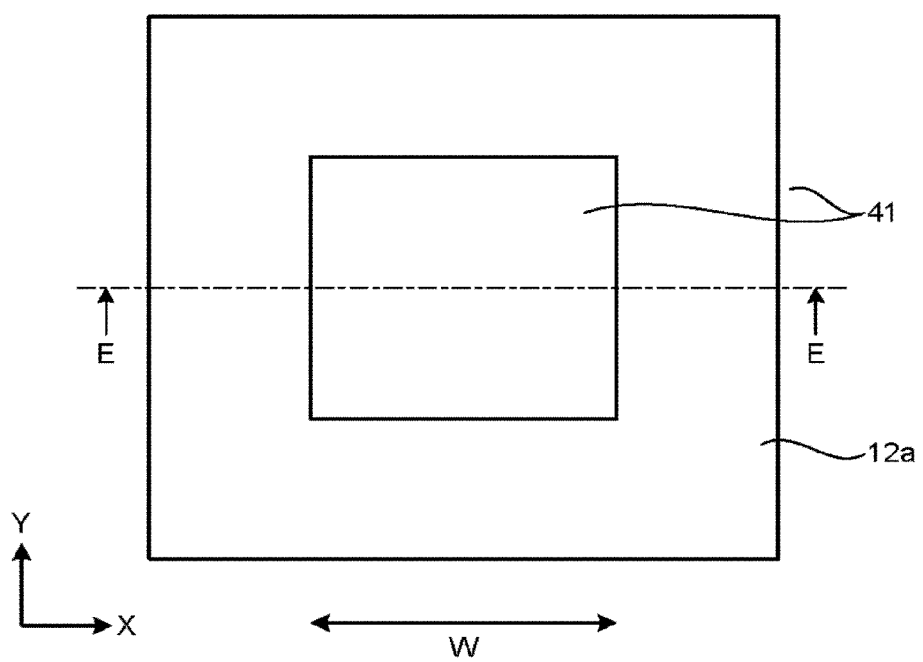
Figure 10B:
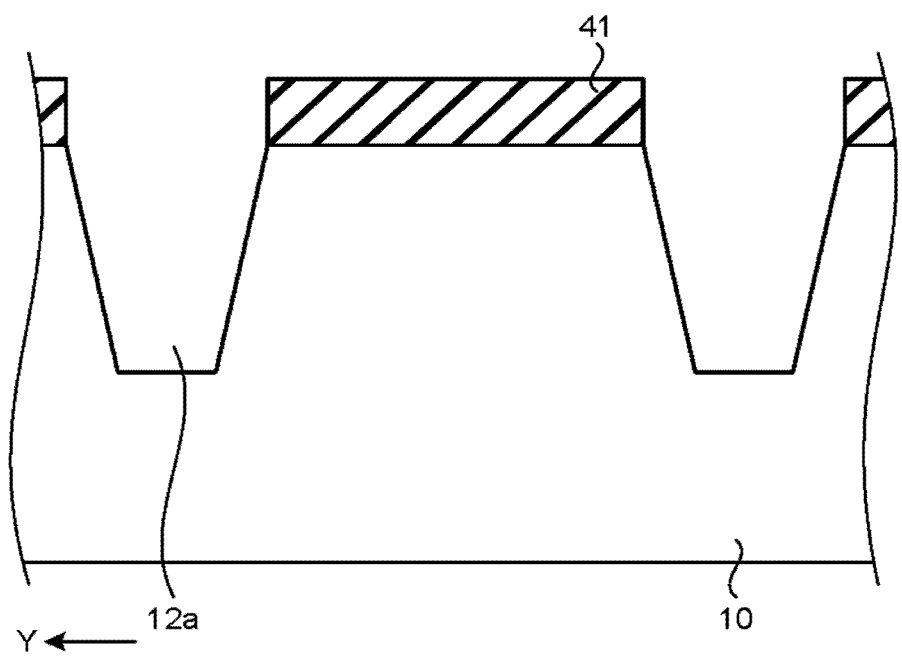

Then, as shown in FIGS. 9B and 10B, a resist (not shown) is applied onto the hard mask film 41, and a pattern having an opening at the formation region of an element isolation insulating film 12 is formed by use of a lithography technique and a development technique. Thereafter, the hard mask film 41 is etched, through the resist serving as a mask, by use of anisotropic etching, such as an RIE (Reactive Ion Etching) method. Further, the semiconductor substrate 10 is etched to a predetermined depth, through the hard mask film 41 serving as a mask, by use of anisotropic etching, such as an RIE method, so that a trench 12a for forming the element isolation insulating film 12 is formed. As shown in FIGS. 9B and 10B, the trench 12a is formed to surround a rectangular area to be used as an active area.

Figure 9C:
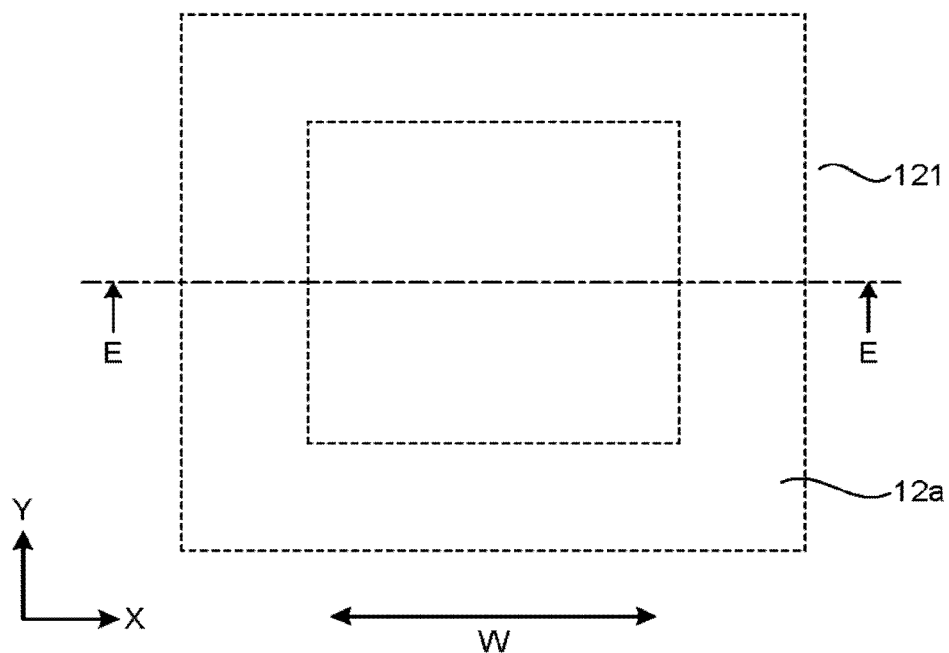
Figure 10C:
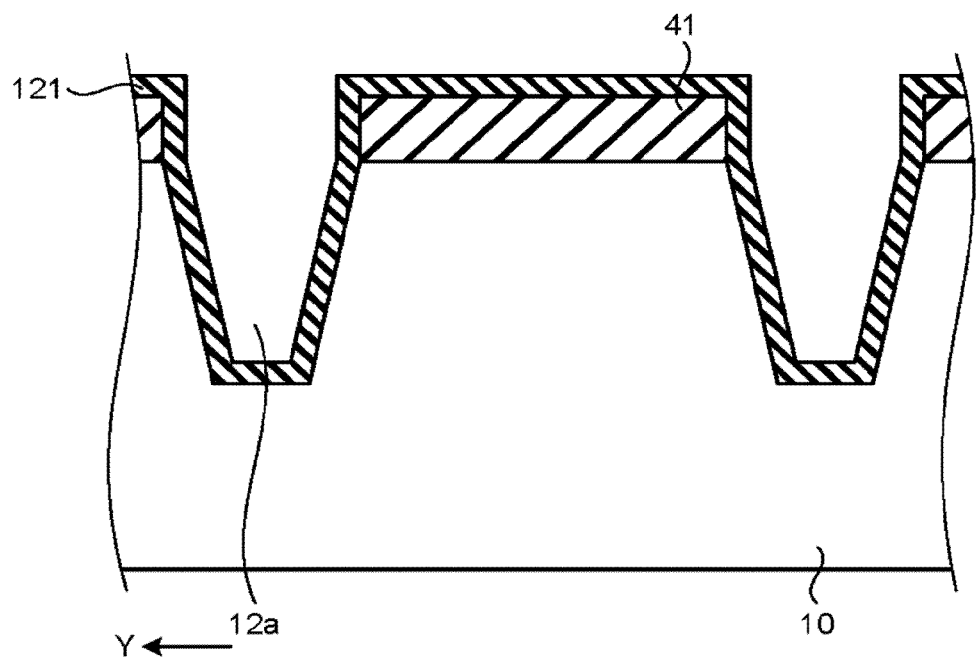

Thereafter, as shown in FIGS. 9C and 10C, a first insulating film 121 is formed above the entire surface of the semiconductor substrate 10. The first insulating film 121 is formed to cover the inner wall of the trench 12a in a conformal state. The thickness of the first insulating film 121 is preferably set to fall within a range of (1/50)×w to (1/2)×w. Alternatively, the thickness of the first insulating film 121 is preferably set to fall within a range of 10 to 50 nm. The first insulating film 121 is made of an insulating material having an etching rate in wet etching higher than that of a second insulating film 122 to be formed later. For example, the first insulating film 121 is made of an insulating material less dense as compared with the second insulating film 122, or made of an insulating material containing an additive added thereto. The first insulating film 121 may be made of an LP-TEOS film or ALD-SiO$_2$ film, for example.

Figure 9D:
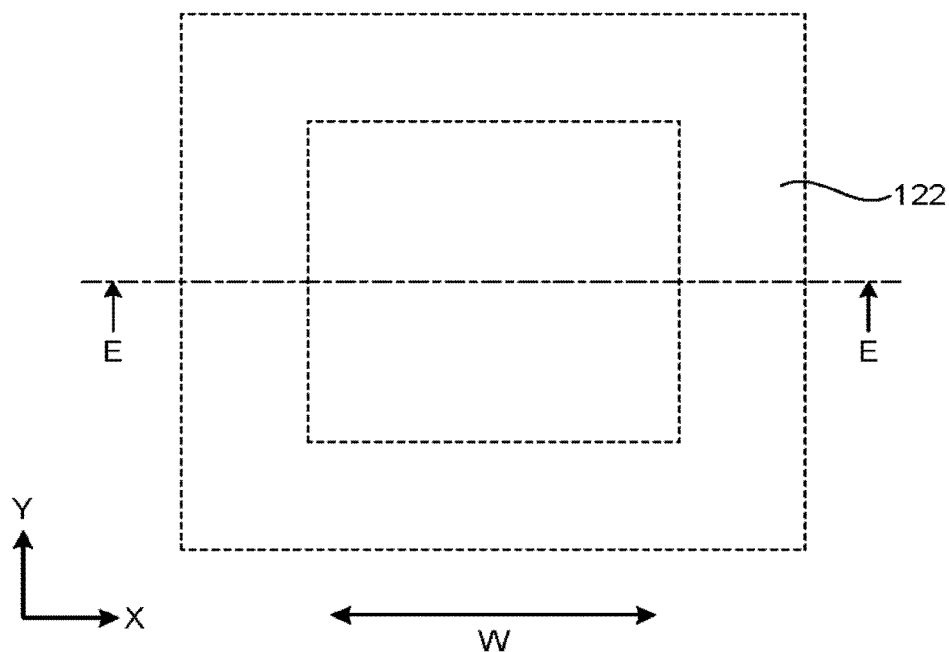
Figure 10D:
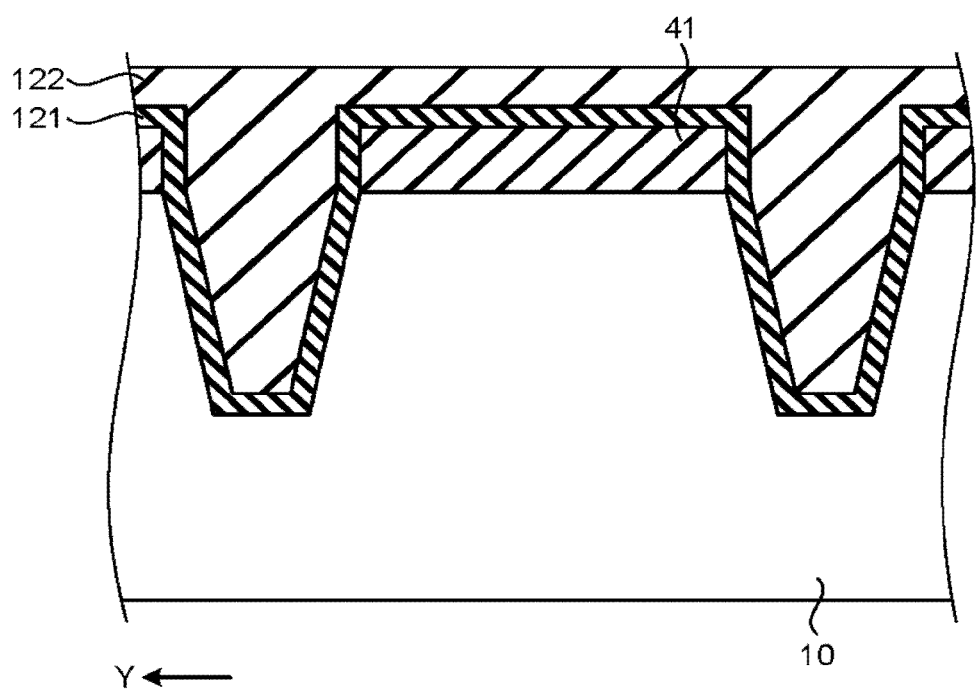

Then, as shown in FIGS. 9D and 10D, a second insulating film 122 is formed on the first insulating film 121. At this time, the second insulating film 122 is formed to fill the trench 12a such that the upper surface of the second insulating film 122 in the trench 12a is higher than the upper surface of the first insulating film 121 at the position where no trench 12a is formed. The second insulating film 122 is made of an insulating material having an etching rate in wet etching lower than that of the first insulating film 121. The second insulating film 122 may be made of HDP-SiO$_2$ or NSG.

Figure 9E:
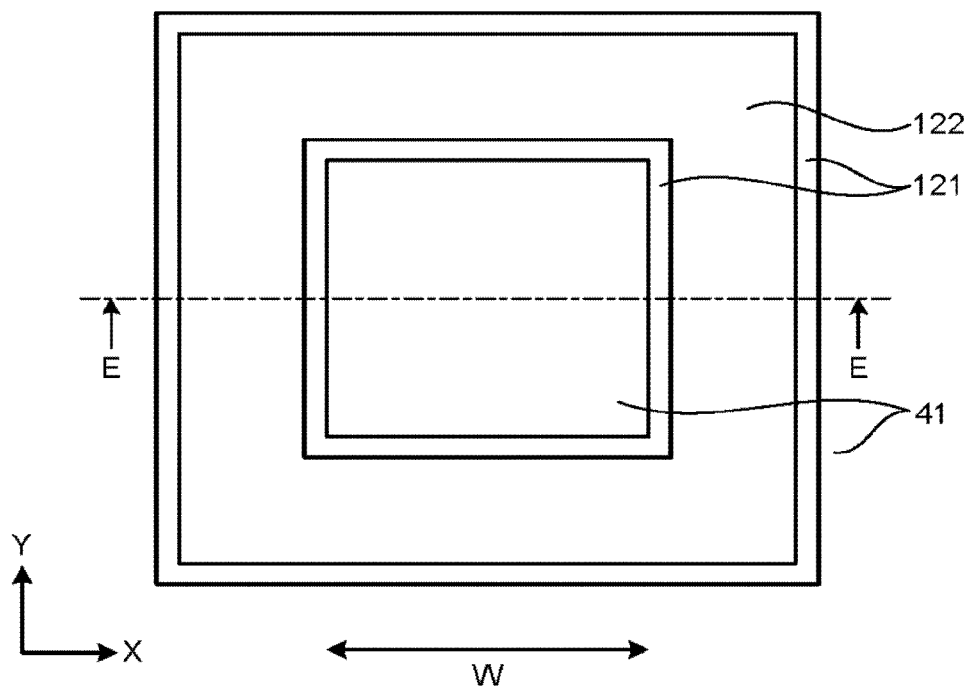
Figure 10E:
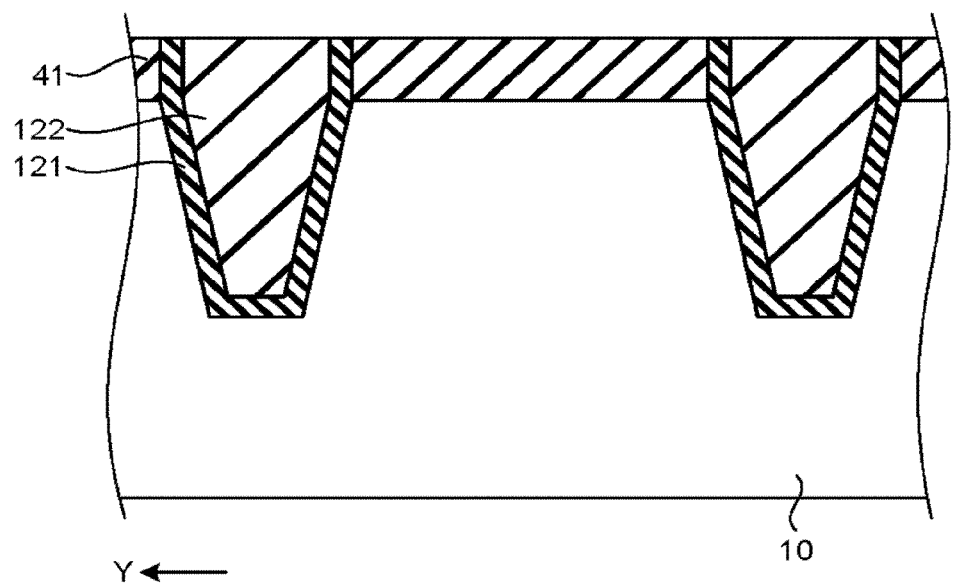

Thereafter, as shown in FIGS. 9E and 10E, the first insulating film 121 and the second insulating film 122 are planarized by removing their parts present above the upper surface of the hard mask film 41, by use of a CMP (Chemical Mechanical Polishing) method or the like, in which the hard mask film 41 serves as a stopper. Consequently, the second insulating film 122 and the first insulating film 121 are exposed from the upper surface of the hard mask film 41, such that the first insulating film 121 is in contact with the outer peripheral side and inner peripheral side of the second insulating film 122.

Figure 9F:
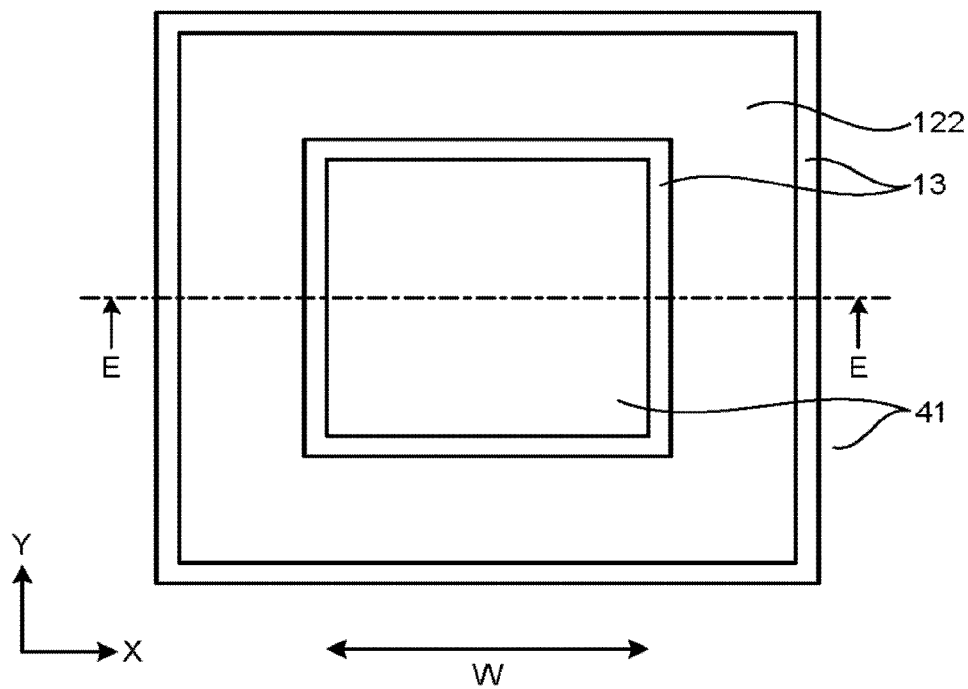
Figure 10F:
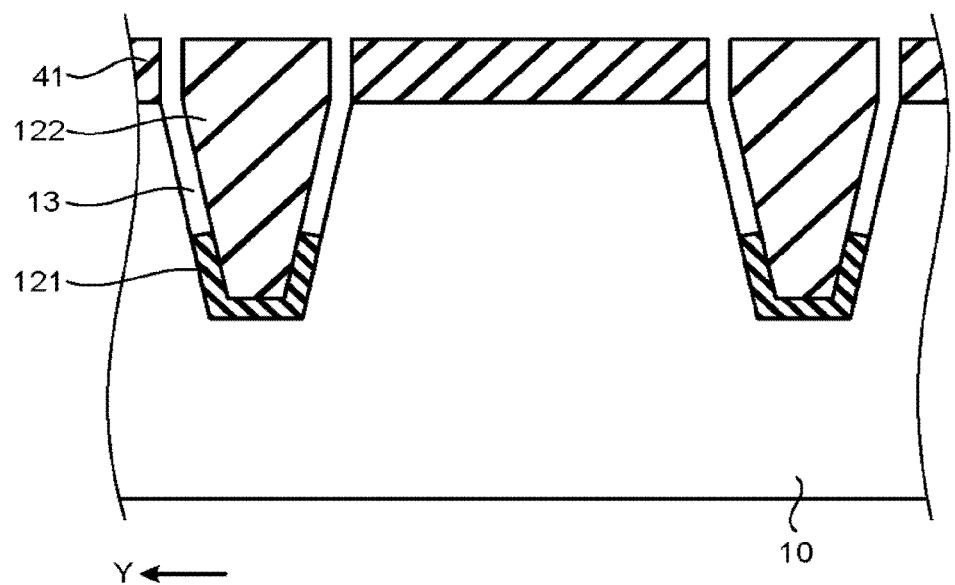

Then, as shown in FIGS. 9F and 10F, the first insulating film 121 is selectively removed by use of wet etching. The first insulating film 121 has essentially the same composition as the second insulating film 122, but is less dense than the second insulating film 122, and so the first insulating film 121 is etched faster than the second insulating film 122. As the etchant, for example, an aqueous solution of ammonium fluoride may be used. Here, if the first insulating film 121 is entirely removed, the second insulating film 122 becomes unstable. Thus, the etching time is controlled to have part of the first insulating film 121 left on the bottom surface of the trench 12a and near the bottom surface. The etching depth is preferably set to fall within a range of (1/2)×d to (2/3)×d. Each portion from which part of the first insulating film 121 is removed becomes an air gap 13.

Figure 9G:
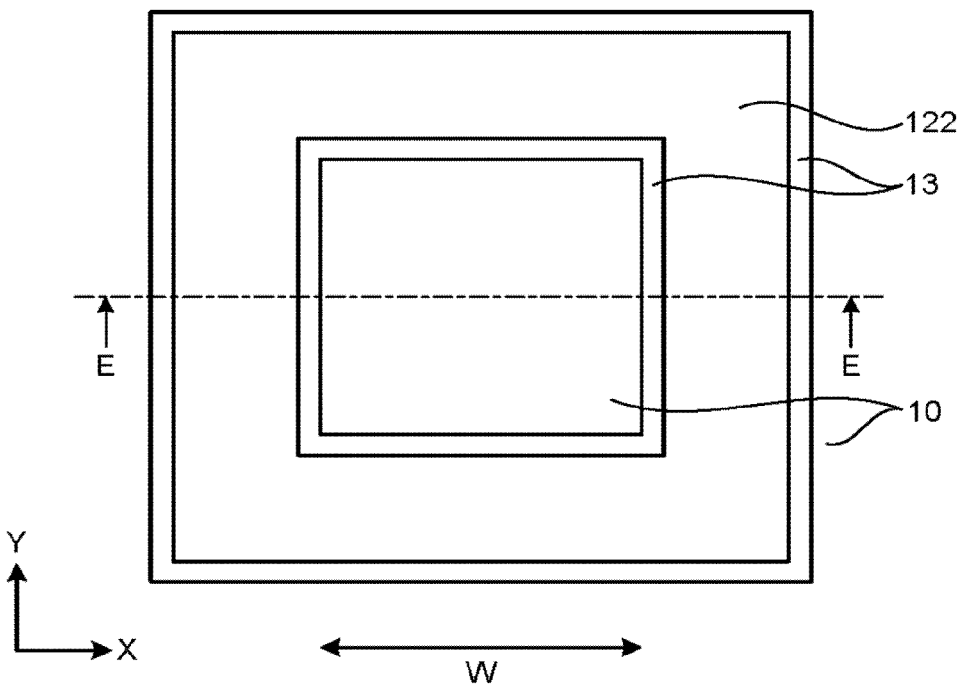
Figure 10G:
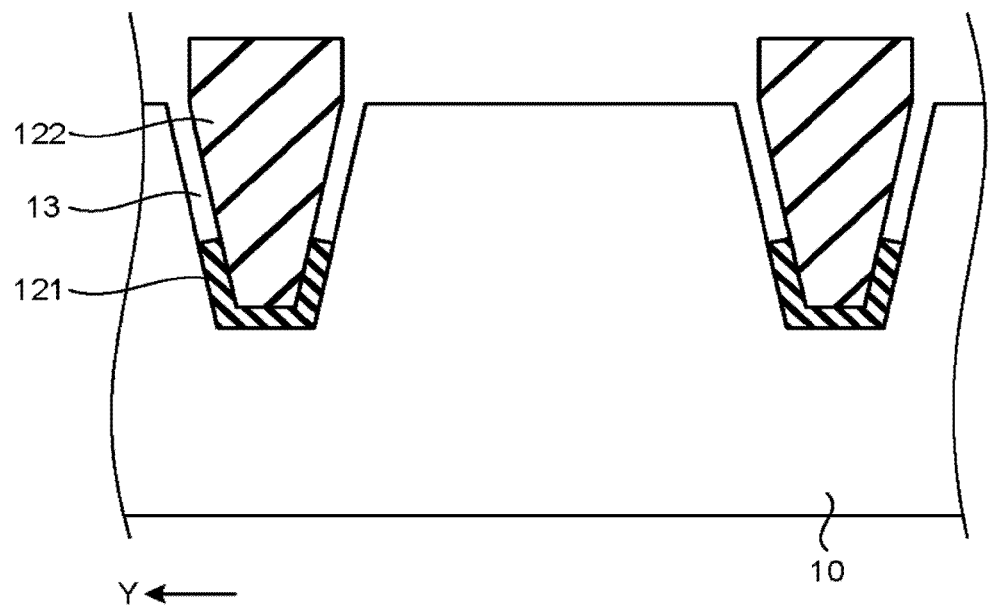

Thereafter, as shown in FIGS. 9G and 10G, the hard mask film 41 is removed. The hard mask film 41 may be removed by use of an wet etching, for example. Consequently, there is provided a state where the upper surface of the second insulating film 122 protrudes from the upper surface of the semiconductor substrate 10.

Figure 9H:
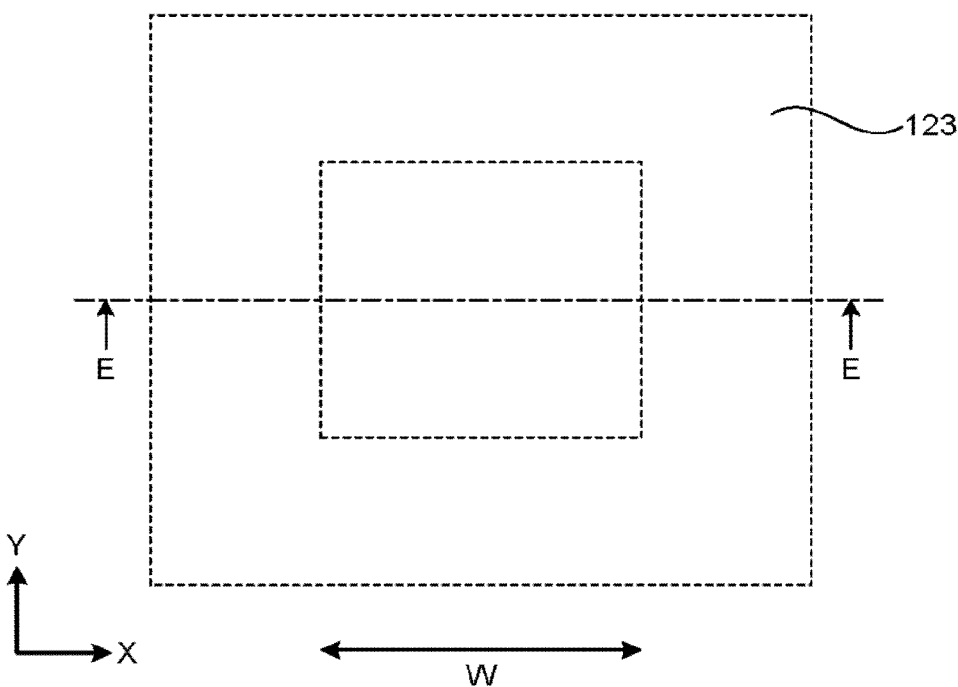
Figure 10H:
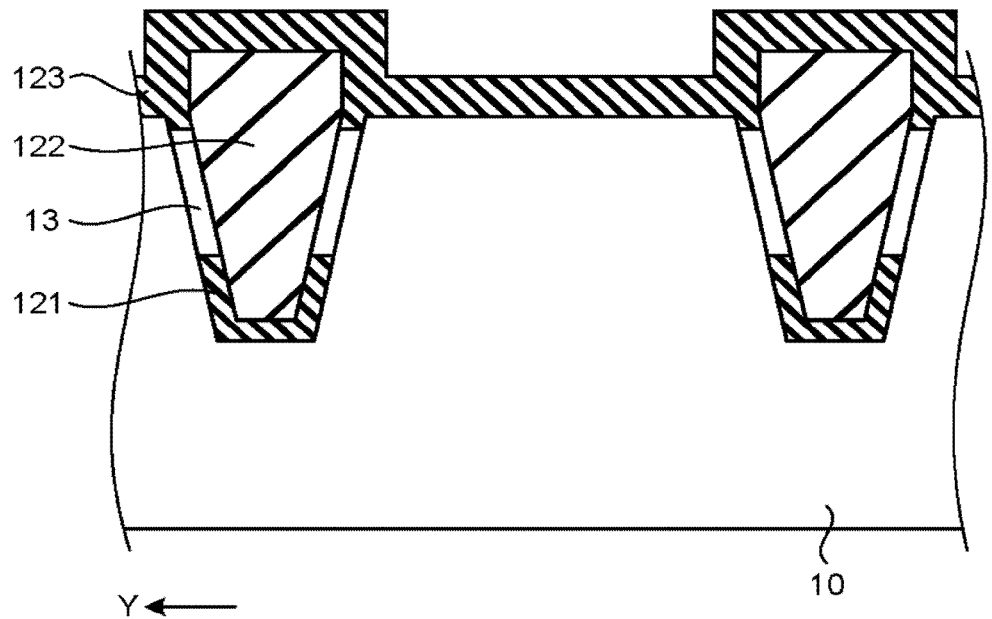

Then, as shown in FIGS. 9H and 10H, a third insulating film 123 is formed on the entire surface of the semiconductor substrate 10. Here, the third insulating film 123 is formed by use of a film formation method having a poor filling property not to fill the inside of the air gap 13. The third insulating film 123 may be formed of an SiO$_2$ film or plasma silane film formed by use of a plasma CVD method, for example. However, the third insulating film 123 may extend into the air gap 13, although it is slight.

Figure 9I:
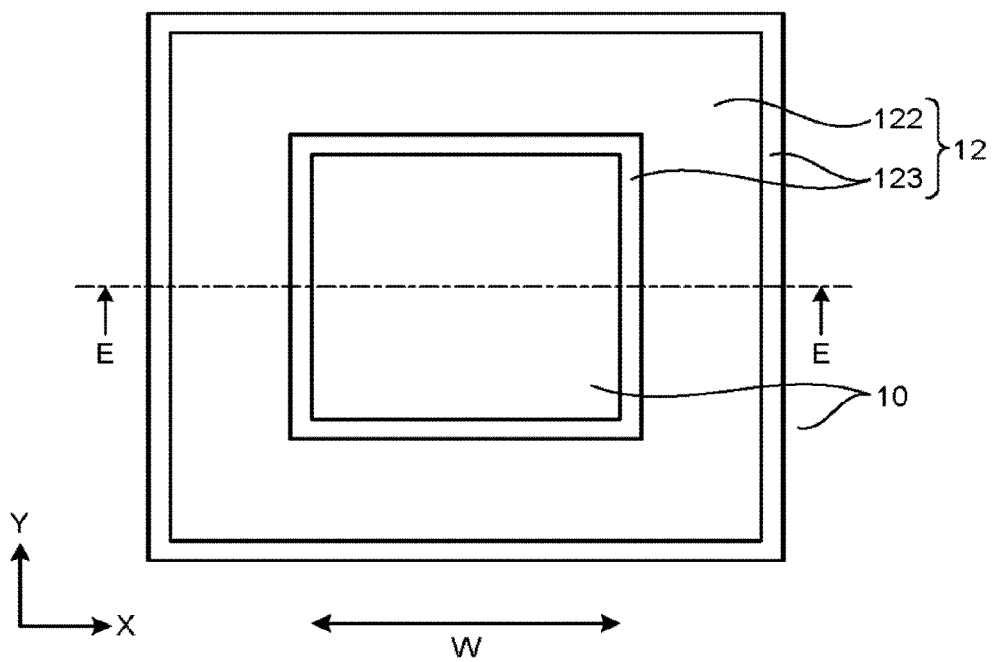
Figure 10I:
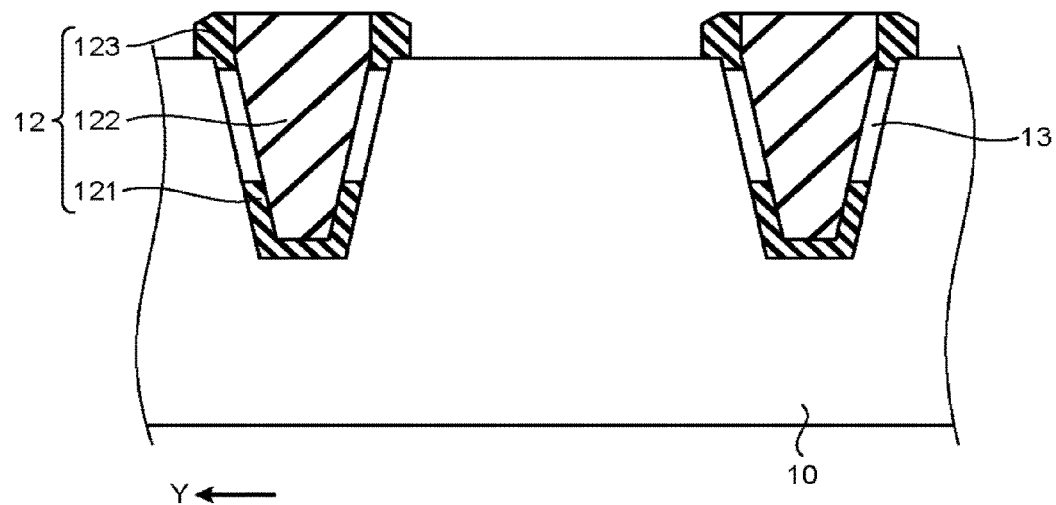

Thereafter, as shown in FIGS. 9I and 10I, the third insulating film 123 is etched back by use of anisotropic etching, such as an RIE method. Consequently, the portions of the third insulating film 123 present on the semiconductor substrate 10 and on the second insulating film 122 are removed, so that sidewall-like portions of the third insulating film 123 are left on the upper side lateral surfaces of the second insulating film 122. Each sidewall-like portion of the third insulating film 123 serves as a cap on the upper side of the air gap 13. Here, the element isolation insulating film 12 composed of the first insulating film 121, the second insulating film 122, and the third insulating film 123 is formed such that it is to be adjacent to a channel region 25 with the air gap 13 interposed therebetween.

Figure 9J:
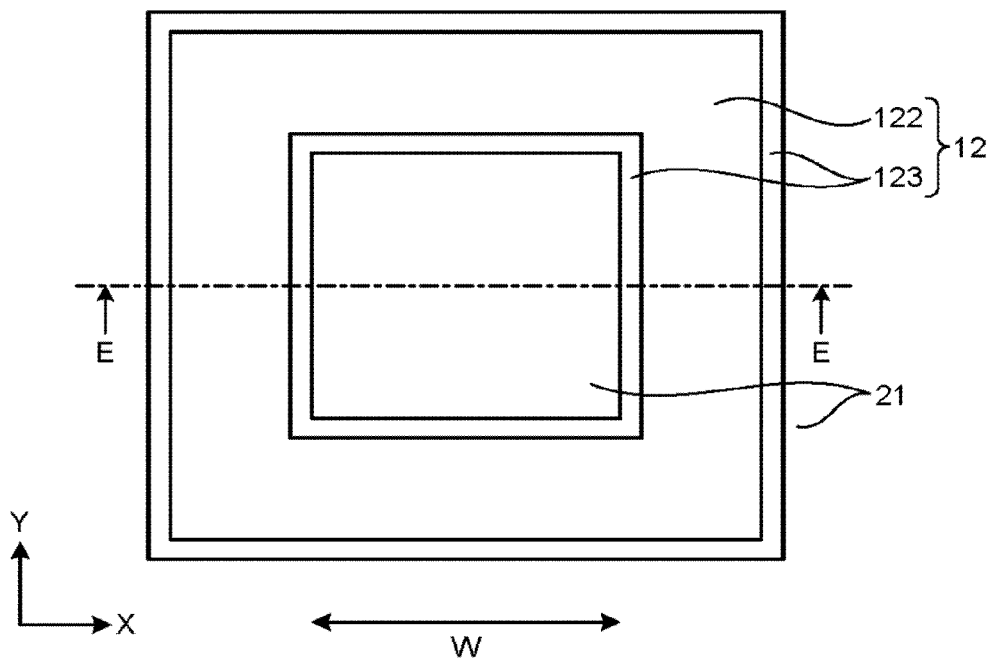
Figure 10J:
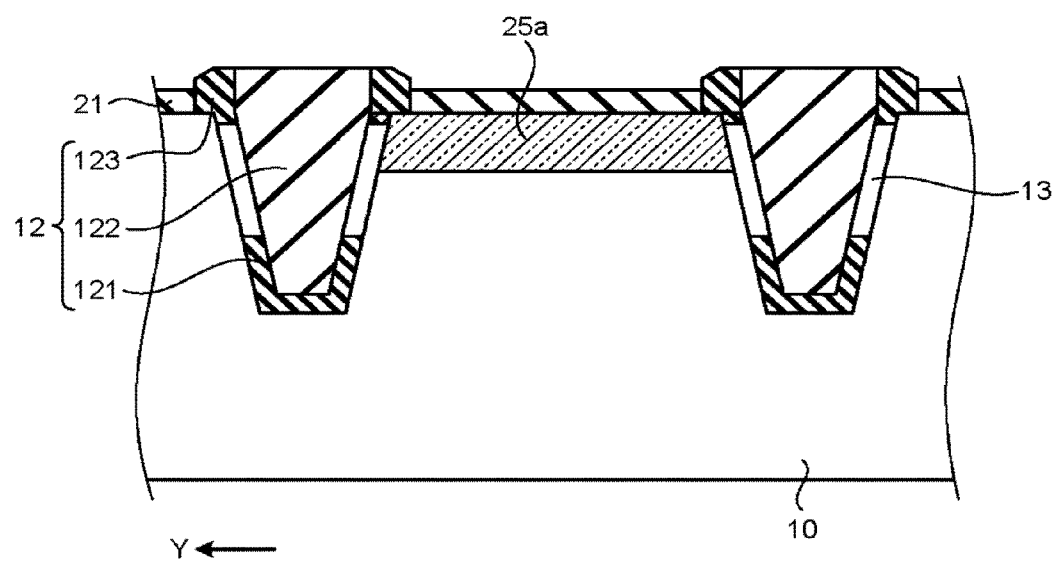

Then, as shown in FIGS. 9J and 10J, a P-type impurity, such as B, is ion-implanted into the active area of the semiconductor substrate 10 at a predetermined depth. Consequently, a diffusion layer 25a to be used as the channel region 25 is formed. Thereafter, a gate insulating film 21 is formed within the area on the semiconductor substrate 10 partitioned by the element isolation insulating film 12. The gate insulating film 21 is formed by use of thermal oxidation to the semiconductor substrate 10, for example.

Figure 9K:
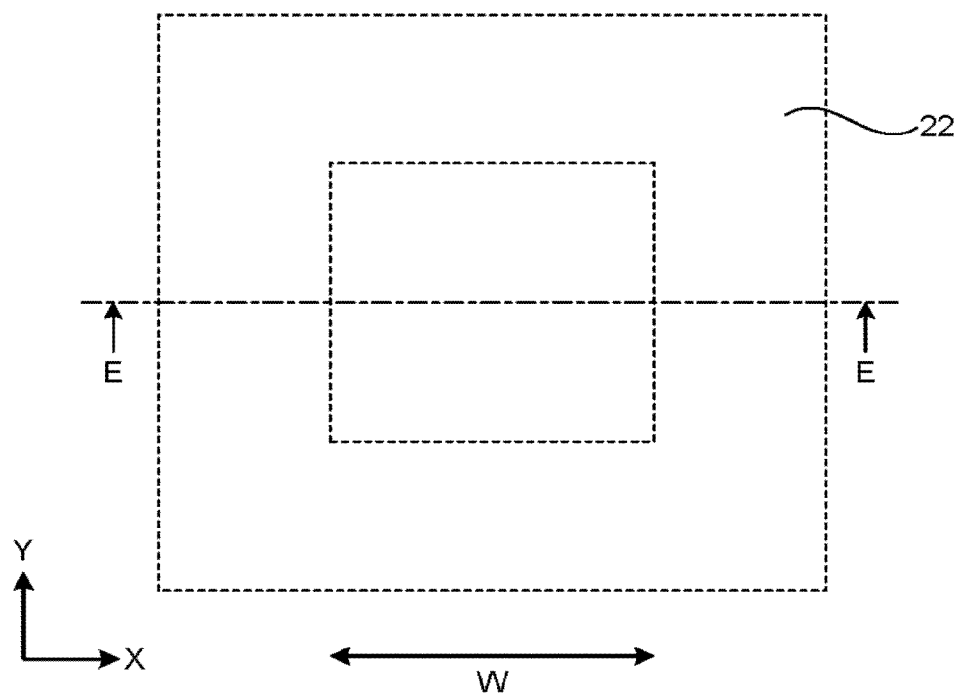

Thereafter, as shown in FIGS. 9K and 10K, the gate electrode film 22 is formed above the semiconductor substrate 10 including the gate insulating film 21 formed thereon. The gate electrode film 22 may be formed of an N-type poly-silicon film, for example.

Then, a resist (not shown) is applied onto the gate electrode film 22. Then, patterning is performed by use of a lithography technique and a development technique, so that a resist pattern is formed on the gate electrode film 22. Thereafter, the gate electrode film 22 and the gate insulating film 21 are etched, through the resist pattern serving as a mask, by use of anisotropic etching, such as an RIE method, so that a gate stack 20 is formed. Then, while the gate stack 20 is used as a mask, an N-type impurity, such as P, is ion-implanted into the semiconductor substrate 10 within the formation region of the MOS transistor. Consequently, source/drain regions 23N for the NMOS transistor are formed. Further, part of the diffusion layer 25a is left only below the gate electrode film 22 and becomes the channel region 25. As a result, the semiconductor device is obtained, as shown in FIGS. 6 to 8.

FIG. 11 is a sectional view schematically showing another structural example of a semiconductor device according to the first embodiment. In the example shown in FIGS. 6 and 7, the air gap 13 is formed on each of the inner peripheral side and outer peripheral side of the element isolation insulating film 12. However, as shown in FIG. 11, the air gap 13 may be formed only on the inner peripheral side of the element isolation insulating film 12. In this case, when the first insulating film 121 is selectively removed, as shown in FIGS. 9F and 10F, the portion of the first insulating film 121 on the outer peripheral side of the second insulating film 122 is covered with a resist or the like, so that only the portion of the first insulating film 121 on the inner peripheral side is removed. Here, the other steps of its manufacturing method are the same as those explained above, and so their description will be omitted.

According to the first embodiment, in the element isolation insulating film 12 partitioning the active area, the portion of the element isolation insulating film 12 contacting with the active area is removed from the upper surface of the semiconductor substrate 10 to a predetermined depth, so that the air gap 13 is formed there. Consequently, B in the channel region 25 (the upper surface of the semiconductor substrate 10) can be suppressed from diffusing into the element isolation insulating film 12. Further, since the element isolation insulating film 12 is partly replaced with the air gap 13, the fixed charge in the element isolation insulating film 12 can be reduced. As a result, it is possible to suppress the narrow channel effect, and thereby to reduce the lowering amount of the threshold voltage caused by a decrease in the gate width w, as shown in the curved line C1 of FIG. 4, as compared with the curved line C11 of the comparative example.

Further, near the upper side of the semiconductor substrate 10, the element isolation insulating film 12 is out of contact with semiconductor substrate 10, and so the channel region 25 do not receive any compressive stress or tensile stress from the material of the element isolation insulating film 12. As a result, it is possible to suppress fluctuations in the transistor characteristics caused by a stress from the element isolation insulating film 12.

Further, if the air gap 13 is formed on each of the outer peripheral side and inner peripheral side of the second insulating film 122, it is possible to suppress stress on each of the outer peripheral side and inner peripheral side of the second insulating film 122.

Further, it is known that stresses are apt to concentrate on the regions of the semiconductor substrate 10 contacting with the upper corner portion and bottom corner portion of the element isolation insulating film 12. These stresses can change the carrier mobility in the channel region 25, and thereby cause fluctuations in the transistor characteristics. However, according to the first embodiment, the region of the element isolation insulating film 12 contacting with the semiconductor substrate 10 is formed with the air gap 13 present from the upper surface of the semiconductor substrate 10 to a predetermined depth as described above, so that the stress applied to the region contacting with the upper corner portion of the element isolation insulating film 12 is relaxed. As a result, it is possible to suppress a change of the carrier mobility in the channel region 25, and thereby to suppress fluctuations in the transistor characteristics.

Further, in a case that the MOS transistor is used for a high-voltage driving transistor, the lower end of the element isolation insulating film 12 is set deeper to prolong the leakage pass, as compared with a low-voltage driving transistor. However, along with an increase in the depth of the element isolation insulating film 12, the volume of the element isolation insulating film 12 increases, and thereby causes a problem such that the semiconductor substrate 10 receives more stress and generates crystal defects or cracks. In this respect, according to the first embodiment, the region of the element isolation insulating film 12 contacting with the semiconductor substrate 10 is formed with the air gap 13 present from the upper surface of the semiconductor substrate 10 to a predetermined depth as described above, so that the stress applied to the region contacting with upper corner portion of the element isolation insulating film 12 is relaxed. As a result, it is possible to reduce the stress applied to the semiconductor substrate 10, to suppress the generation of crystal defects, and to reduce the junction leakage current. Consequently, it is possible to suppress the leakage current between elements, while reducing the surface area of the peripheral circuit part including the high-voltage driving transistor.

Second Embodiment

As described above, a non-volatile memory device, such as a NAND type flash memory, includes a memory cell part and a peripheral circuit part. In the peripheral circuit part, a CMOS (Complementary MOS) transistor composed of a combination of an NMOS transistor and a PMOS transistor is used. In the second embodiment, an explanation will be given of an improvement of NMOS transistor characteristics without degrading PMOS transistor characteristics and an improvement of PMOS transistor characteristics without degrading NMOS transistor characteristics by using air gap in an element isolating insulating film in either NMOS or PMOS transistor region in the peripheral circuit part.

Figure 12:
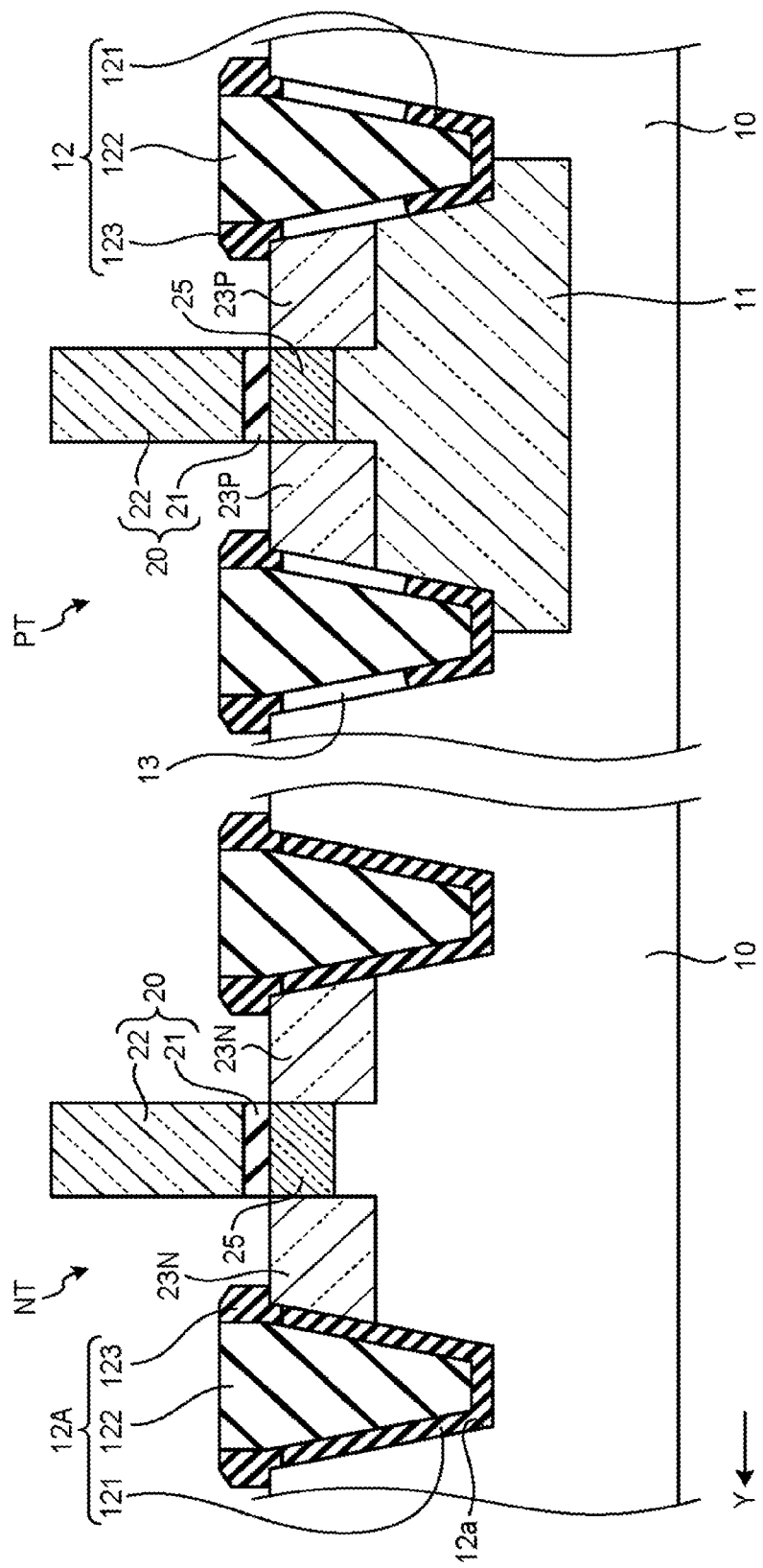
FIG. 12 is a sectional view schematically showing a cross section in the gate length direction of a structural example of a semiconductor device according to a second embodiment.
Figure 13:
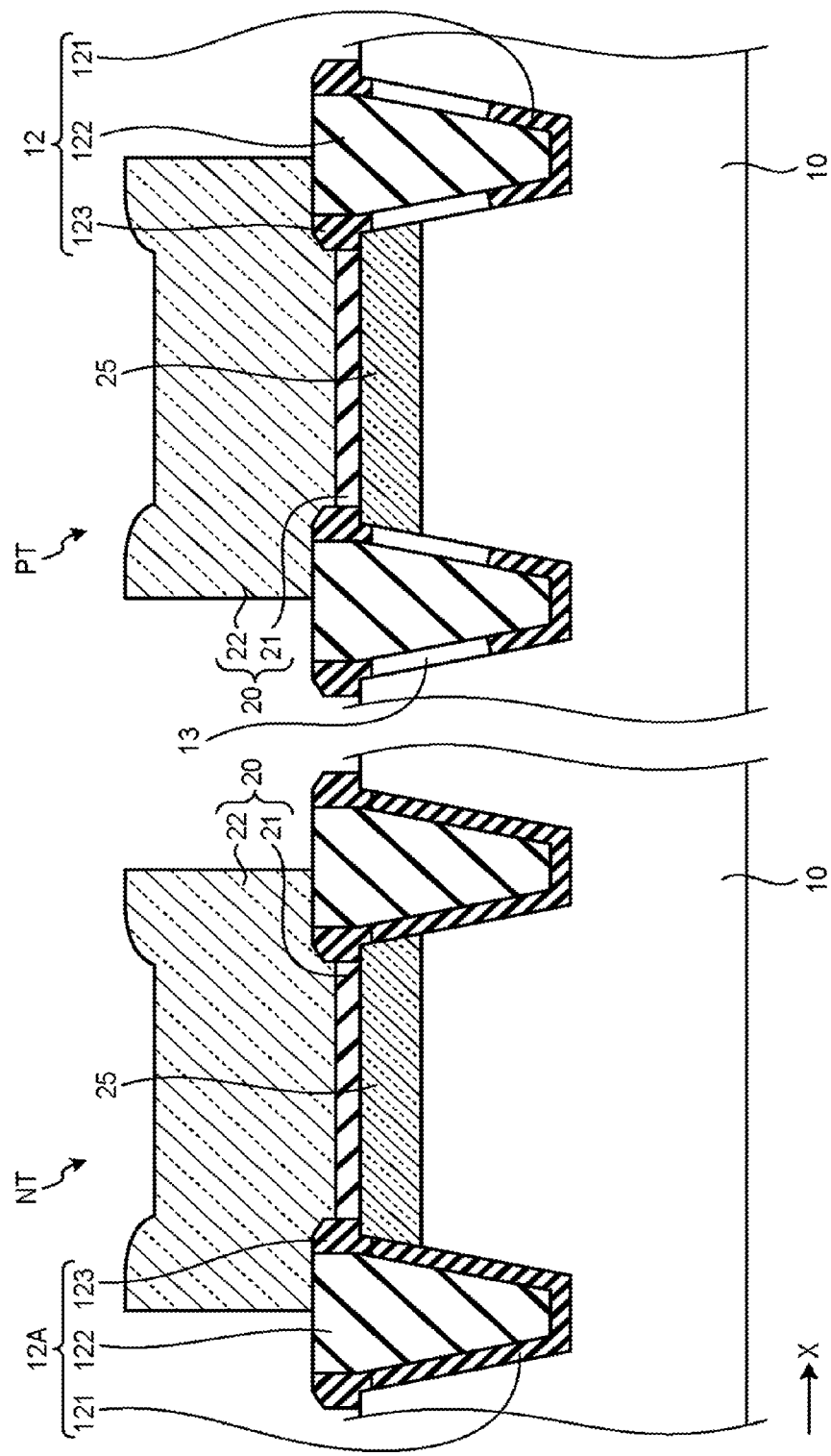
FIG. 13 is a sectional view schematically showing a cross section in the gate width direction of the structural example of a semiconductor device according to the second embodiment.

FIG. 12 is a sectional view schematically showing a cross section in the gate length direction of a structural example of a semiconductor device according to the second embodiment. FIG. 13 is a sectional view schematically showing a cross section in the gate width direction of the structural example of a semiconductor device according to the second embodiment. Each of FIGS. 12 and 13 illustrates an NMOS transistor NT and a PMOS transistor PT together in a single figure.

Each of the NMOS transistor NT and the PMOS transistor PT has a structure basically the same as that of the MOS transistor described in the first embodiment. However, the NMOS transistor NT is formed on a P-type semiconductor substrate 10, and its source/drain regions 23N are respectively formed of N-type impurity diffusion layers. On the other hand, the PMOS transistor PT is formed on an N-type well 11 formed in the P-type semiconductor substrate 10, and its source/drain regions 23P are respectively formed of P-type impurity diffusion layers.

Here, it is assumed that the second insulating film 122 included in the element isolation insulating film 12 is made of NSG. Since the NSG is a shrinkable material, if the NSG is used as the second insulating film 122, a tensile stress is applied to the channel region 25, as shown in FIG. 5A. As described above, when the tensile stress is applied to the channel region 25, the electron mobility in the channel is increased on the NMOS transistor NT side, and the hole mobility in the channel is decreased on the PMOS transistor PT side. In consideration of this, in order to suppress a decrease in the hole mobility of the PMOS transistor PT, as shown in FIGS. 12 and 13, the PMOS transistor PT is provided with the element isolation insulating film 12 formed with the air gap 13 between itself and the element arrangement area, as described in the first embodiment, and the NMOS transistor NT is provided with an element isolation insulating film 12A formed without the air gap 13 between itself and the element arrangement area. The element isolation insulating film 12A is composed of an first insulating film 121 covering the entire inner surface of a trench 12a, a second insulating film 122 formed on top of the first insulating film 121 and filling the trench 12a, and a third insulating film 123 formed on the lateral surfaces of the second insulating film 122 protruding from the upper surface of the semiconductor substrate 10. Here, the first insulating film 121 may be formed of an LP-TEOS film or ALD-SiO$_2$ film.

As described above, in the NMOS transistor NT, the channel region 25 receive a tensile stress from the element isolation insulating film 12A, and so the electron mobility in the channel is increased. On the other hand, in the PMOS transistor PT, the channel region 25 do not receive a tensile stress in the X-direction from the element isolation insulating film 12 because of the air gap 13, and so a decrease in the hole mobility in the channel is suppressed.

Figure 14:
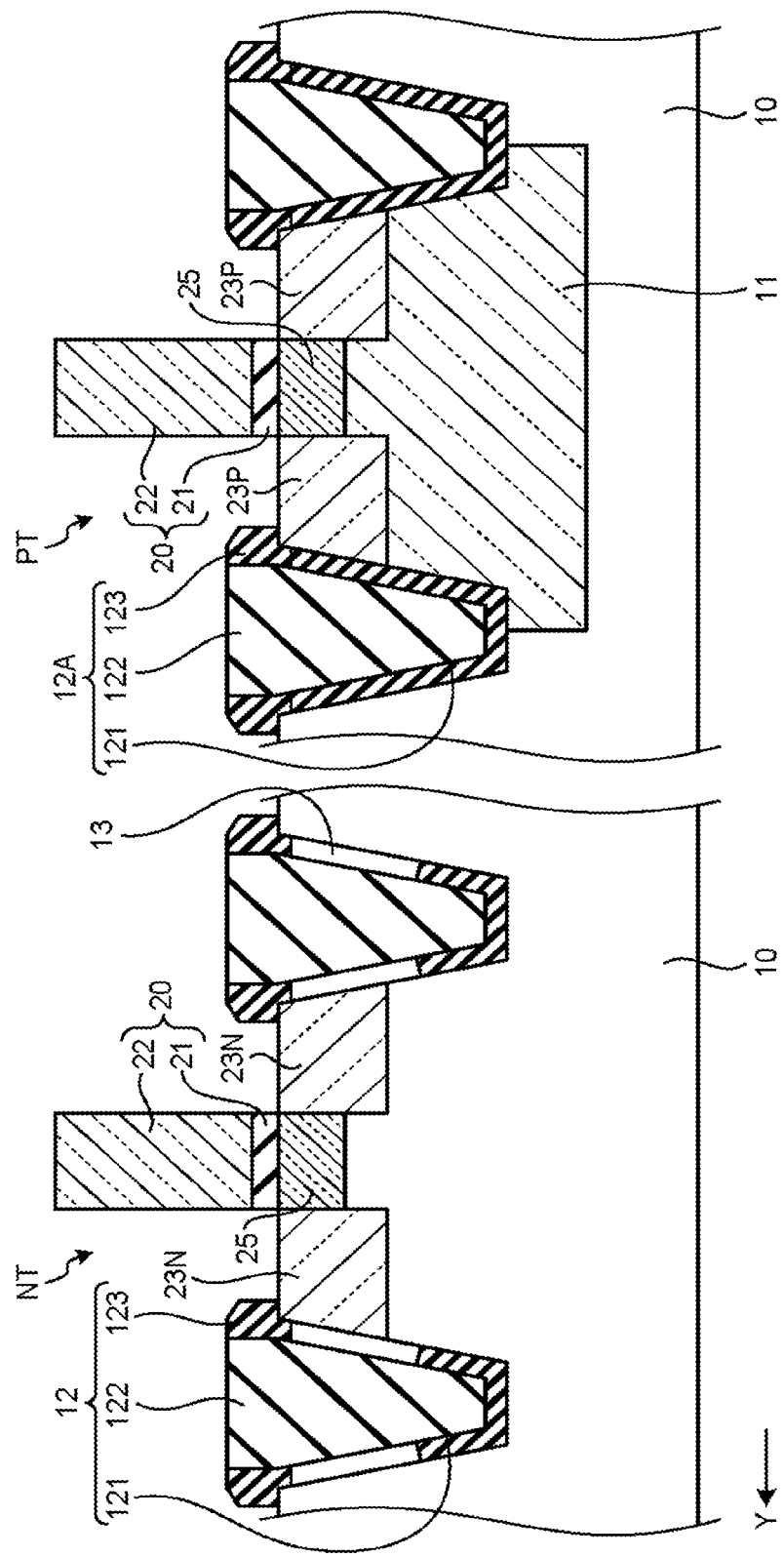
FIG. 14 is a sectional view schematically showing a cross section in the gate length direction of another structural example of a semiconductor device according to the second embodiment.

FIG. 14 is a sectional view schematically showing a cross section in the gate length direction of another structural example of a semiconductor device according to the second embodiment. FIG. 15 is a sectional view schematically showing a cross section in the gate width direction of the other structural example of a semiconductor device according to the second embodiment. Again, each of FIGS. 14 and 15 illustrates an NMOS transistor NT and a PMOS transistor PT together in a single figure. Further, the NMOS transistor NT and the PMOS transistor PT respectively have structures essentially the same as those shown in FIGS. 12 and 13.

Here, it is assumed that the second insulating film 122 included in the element isolation insulating film 12 is made of HDP-SiO$_2$. Since the HDP-SiO$_2$ is an expandable material, if the HDP-SiO$_2$ is used as the second insulating film 122, a compressive stress is applied to the channel region 25, as shown in FIG. 5B. As described above, when the compressive stress is applied to the channel region 25, the electron mobility in the channel is decreased on the NMOS transistor NT side, and the hole mobility in the channel is increased in on the PMOS transistor PT side. In consideration of this, in order to suppress a decrease in the electron mobility of the NMOS transistor NT, as shown in FIGS. 14 and 15, the NMOS transistor NT is provided with the element isolation insulating film 12 formed with the air gap 13 between itself and the element arrangement area, as described in the first embodiment, and the PMOS transistor PT is provided with the element isolation insulating film 12A formed without the air gap 13 between itself and the element arrangement area. Here, the first insulating film may be formed of an LP-TEOS film or ALD-SiO$_2$ film.

As described above, in the PMOS transistor PT, the channel region 25 receive a compressive stress from the element isolation insulating film 12A, and so the hole mobility in the channel is increased. On the other hand, in the NMOS transistor NT, the channel region 25 do not receive a compressive stress in the X-direction from the element isolation insulating film 12 because of the air gap 13, and so a decrease in the electron mobility in the channel is suppressed.

A manufacturing method of a CMOS transistor having one of the structures shown in FIGS. 12 to 15 is almost the same as the manufacturing method of a MOS transistor described in the first embodiment. However, when the first insulating film 121 is selectively removed, as shown in FIGS. 9F and 10F, the portion of the first insulating film 121 on the side excluding the air gap 13 of the element isolation insulating film 12 is covered with a resist or the like. Further, when the source/drain regions 23N of the NMOS transistor NT are formed by use of the gate stack 20 as a mask, the formation region of the PMOS transistor PT is covered with a resist, and ions of an N-type impurity are ion-implanted, while the gate stack 20 of the NMOS transistor NT is used as a mask. When the source/drain regions 23P of the PMOS transistor PT are formed, the formation region of the NMOS transistor NT is covered with a resist, and ions of a P-type impurity are ion-implanted, while the gate stack 20 of the PMOS transistor PT is used as a mask.

According to the second embodiment, in the CMOS transistor composed of the NMOS transistor NT and the PMOS transistor PT, when a material that applies a tensile stress to the channel region 25 is used as the element isolation insulating film, the PMOS transistor PT is provided with the element isolation insulating film 12 formed with the air gap 13 between itself and the element arrangement area, and the NMOS transistor NT is provided with the element isolation insulating film 12A formed without the air gap 13 between itself and the element arrangement area. Consequently, it is possible to suppress a decrease in the hole mobility of the PMOS transistor PT, while increasing the electron mobility of the NMOS transistor NT. On the other hand, when a material that applies a compressive stress to the channel region 25 is used as the element isolation insulating film, the NMOS transistor NT is provided with the element isolation insulating film 12 formed with the air gap 13 between itself and the element arrangement area, and the PMOS transistor PT is provided with the element isolation insulating film 12A formed without the air gap 13 between itself and the element arrangement area. Consequently, it is possible to suppress a decrease in the electron mobility of the NMOS transistor NT, while increasing the hole mobility of the PMOS transistor PT. Thus, it is possible to improve the performances of both of the NMOS transistor NT and the PMOS transistor PT.

Further, as shown in FIG. 5A, the lengths A and B of a MOS transistor can change the carrier mobility in the channel. In other words, the carrier mobility in the channel has layout dependency. Accordingly, a layout difference ends up generating a factor of causing fluctuations of transistor characteristics, i.e., increasing variations. However, if the MOS transistor has a structure that can hardly receive any stress from the element isolation insulating film 12, as described above, it is possible to reduce the layout dependency of the carrier mobility in the channel.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
an element isolation insulating film having a first depth and partitioning an element arrangement area on one main face side of a semiconductor substrate;
a gate electrode film disposed above the semiconductor substrate within the element arrangement area, through a gate insulating film, and extending in a first direction;
source/drain regions containing a first impurity of a predetermined conductivity type diffused therein, the source/drain regions being disposed near a surface of the semiconductor substrate on both sides of the gate electrode film in a second direction perpendicular to the first direction;
a channel region containing a second impurity of a predetermined conductivity type diffused therein, the channel region being disposed near a surface of the semiconductor substrate below the gate electrode film; and
an air gap disposed at a region of the element isolation insulating film contacting the channel region.

2. The semiconductor device according to claim 1, wherein the element isolation insulating film is buried in a trench formed in the semiconductor substrate, and
the air gap has a second depth smaller than the first depth.

3. The semiconductor device according to claim 1, wherein the air gap has a width falling within a range of ½ to ⅕₀ of a width of the element isolation insulating film at an upper surface of the semiconductor substrate, and
the second depth falls within a range of ½ to ⅔ of the first depth.

4. The semiconductor device according to claim 1, wherein the element isolation insulating film includes a first insulating film and a second insulating film, the first insulating film having a first thickness and being disposed on an inner surface of a trench formed in the semiconductor substrate, and the second insulating film filling an inside of the trench including the first insulating film disposed thereon and having an upper surface protruding from an upper surface of the semiconductor substrate, and the air gap corresponds to a portion at a region of the first insulating film contacting with the channel region, from which the first insulating film is partly removed.

5. The semiconductor device according to claim 4, wherein the air gap corresponds to a portion at a region of the first insulating film contacting with the element arrangement area, from which the first insulating film is partly removed.

6. The semiconductor device according to claim 4, wherein the first insulating film is made of a material having an etching rate larger than that of the second insulating film.

7. The semiconductor device according to claim 4, wherein the second insulating film is made of a material that generates a tensile stress onto the element arrangement area.

8. The semiconductor device according to claim 7, wherein the first impurity is a P-type impurity.

9. The semiconductor device according to claim 4, wherein the second insulating film is made of a material that generates a compressive stress onto the element arrangement area.

10. The semiconductor device according to claim 9, wherein the first impurity is an N-type impurity.

11. A semiconductor device comprising:
an element isolation insulating film having a first depth and partitioning a first element arrangement area and a second element arrangement area on one main face side of a semiconductor substrate;
a first field effect transistor disposed on the semiconductor substrate within the first element arrangement area, the first field effect transistor including a first gate electrode film disposed on a first gate insulating film and extending in a first direction, first source/drain regions containing a first impurity of a first conductivity type diffused therein, a first channel region containing a second impurity of a predetermined conductivity type diffused therein, and an air gap disposed at a region of the element isolation insulating film contacting the first element arrangement areas, the first source/drain regions being disposed near a surface of the semiconductor substrate on both sides of the first gate electrode film in a second direction perpendicular to the first direction, and the first channel region being disposed near a surface of the semiconductor substrate below the first gate electrode film, and
a second field effect transistor disposed on the semiconductor substrate within the second element arrangement area, the second field effect transistor including a second gate electrode film disposed on a second gate insulating film and extending in a third direction, second source/drain regions containing a third impurity of a second conductivity type diffused therein, and a second channel region containing the second impurity diffused therein, the second source/drain regions being disposed near a surface of the semiconductor substrate on both sides of the second gate electrode film in a fourth direction perpendicular to the third direction, and the second channel region being disposed near a surface of the semiconductor substrate below the second gate electrode film.

12. The semiconductor device according to claim 11, wherein the element isolation insulating film is made of a material that generates a tensile stress onto the first element arrangement area and the second element arrangement area,
the first impurity is a P-type impurity, and
the third impurity is an N-type impurity.

13. The semiconductor device according to claim 11, wherein the element isolation insulating film is made of a material that generates a compressive stress onto the first element arrangement area and the second element arrangement area,
the first impurity is an N-type impurity, and
the third impurity is a P-type impurity.

* * * * *